United States Patent
Oh et al.

(10) Patent No.: US 8,138,490 B2
(45) Date of Patent: Mar. 20, 2012

(54) VARIABLE RESISTANCE NON-VOLATILE MEMORY CELLS AND METHODS OF FABRICATING SAME

(75) Inventors: Gyu-Hwan Oh, Hwaseong-si (KR); Shin-Jae Kang, Yongin-si (KR); In-Sun Park, Suwon-si (KR); Hyun-Seok Lim, Suwon-si (KR); Nak-Hyun Lim, Yongin-si (KR); Hyun-Suk Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 98 days.

(21) Appl. No.: 12/796,084

(22) Filed: Jun. 8, 2010

(65) Prior Publication Data

US 2010/0243982 A1  Sep. 30, 2010

Related U.S. Application Data

(62) Division of application No. 11/848,379, filed on Aug. 31, 2007, now Pat. No. 7,759,159.

(30) Foreign Application Priority Data

Jun. 18, 2007 (KR) .................. 10-2007-0059273

(51) Int. Cl.
 *H01L 47/00* (2006.01)
 *H01L 27/108* (2006.01)
 *H01L 29/94* (2006.01)
 *H01L 31/032* (2006.01)

(52) U.S. Cl. .......... 257/4; 257/3; 257/296; 257/E31.029

(58) Field of Classification Search .................. 257/3, 4, 257/296, E31.029
See application file for complete search history.

(56) References Cited

U.S. PATENT DOCUMENTS

| 6,586,761 | B2 * | 7/2003 | Lowrey ............................. 257/3 |
| 6,649,928 | B2 | 11/2003 | Dennison |
| 6,969,866 | B1 | 11/2005 | Lowrey et al. |
| 7,329,579 | B2 * | 2/2008 | Ha et al. ......................... 438/257 |
| 7,332,401 | B2 | 2/2008 | Moore et al. |
| 7,884,343 | B2 * | 2/2011 | Lung et al. ......................... 257/2 |
| 7,993,957 | B2 * | 8/2011 | Bez et al. ......................... 438/98 |
| 2006/0043355 | A1 * | 3/2006 | Ryoo et al. ......................... 257/2 |

(Continued)

FOREIGN PATENT DOCUMENTS

JP  2002-540605 A  11/2002

(Continued)

OTHER PUBLICATIONS

Office Action, Korean Application No. 10-2007-0059273, Mar. 25, 2008.

*Primary Examiner* — Luan C Thai
(74) *Attorney, Agent, or Firm* — Myers Bigel Sibley & Sajovec, P.A.

(57) ABSTRACT

Methods of fabricating integrated circuit memory cells and integrated circuit memory cells are disclosed. An integrated circuit memory cell can be fabricated by forming an ohmic layer on an upper surface of a conductive structure and extending away from the structure along at least a portion of a sidewall of an opening in an insulation layer. An electrode layer is formed on the ohmic layer. A variable resistivity material is formed on the insulation layer and electrically connected to the electrode layer.

20 Claims, 24 Drawing Sheets

U.S. PATENT DOCUMENTS

| | | |
|---|---|---|
| 2006/0072370 A1 | 4/2006 | Kuh et al. |
| 2006/0284237 A1 | 12/2006 | Park et al. |
| 2007/0117315 A1* | 5/2007 | Lai et al. .................. 438/257 |
| 2008/0042118 A1* | 2/2008 | Hayakawa .................. 257/4 |

FOREIGN PATENT DOCUMENTS

| | | |
|---|---|---|
| JP | 2007-5785 A | 1/2007 |
| JP | 2008-283179 A | 11/2008 |
| JP | 2009-4785 A | 1/2009 |
| KR | 10-0441692 B1 | 7/2004 |
| KR | 10-2006-0133394 A | 12/2006 |
| KR | 10-0655796 B1 | 12/2006 |
| KR | 10-2007-0031714 A | 3/2007 |
| KR | 10-2009-0002548 A | 1/2009 |
| KR | 10-0881055 B1 | 1/2009 |
| KR | 10-0883412 B1 | 2/2009 |

* cited by examiner

A

VARIABLE RESISTANCE NON-VOLATILE MEMORY CELLS AND METHODS OF FABRICATING SAME

CROSS-REFERENCE TO RELATED APPLICATION

This application is a divisional of U.S. patent application Ser. No. 11/848,379, filed Aug. 31, 2007, which itself claims priority under 35 USC §119 to Korean Patent Application No. 10-2007-0059273, filed on Jun. 18, 2007, the disclosures of both of which are hereby incorporated herein by reference in their entirety as if set forth fully herein.

FIELD OF THE INVENTION

The present invention relates to non-volatile memory devices and related manufacturing methods, and more specifically to variable resistance non-volatile memory devices and related manufacturing methods.

BACKGROUND OF THE INVENTION

Non-volatile memory devices are widely used in many consumer, commercial and other applications. While some non-volatile memory devices, such as flash memory, use accumulated charge to store data, some other memory devices, such as resistive random access memory (RRAM), phase change RAM (PRAM), and magnetic RAM (MRAM), use change in resistivity of a material therein to store data.

A resistive memory cell generally includes a first electrode, a second electrode, and a variable resistivity material connected therebetween. The resistive memory cell can be configured so that the resistivity of the material is controlled in response to a voltage that is applied between the first and second electrodes.

A PRAM device may include a phase changeable material layer which functions as a variable resistivity material. In response to sufficient heat, the phase changeable material layer may change phase so that its resistance changes and remains changed after its temperature returns to a pre-heating level. The phase changeable material layer may be formed from a chalcogenide material that includes germanium (Ge), antimony (Sb), and/or tellurium (Te). The phase of the material can be controlled in response to a level of current and/or duration of current that is applied to an electrode to heat the material a sufficient amount to change its phase. The resistance of the phase changeable material layer varies in response with its phase. For example, when the phase changeable material has a crystalline state, its resistance can be substantially less than when the phase changeable material layer has an amorphous state. Accordingly, the resistance of the phase changeable material in a PRAM device is controlled to store a logic value and is sensed to read the logic value.

FIGS. 1A-G are cross-sectional views illustrating a conventional method of manufacturing a phase changeable memory device. Referring to FIG. 1A, an electrical insulation layer 112 is formed on a substrate 100. The insulation layer 112 may be formed from, for example, silicon oxide and/or silicon nitride. A photo resist pattern is then formed on the insulation layer 112. The insulation layer 112 is patterned using the photo resist pattern as a mask to form an opening 115 that exposes a portion of the substrate 100. The opening 117 may expose, for example, an impurity region in the substrate 100 that serves as a conductive region for the memory device.

A semiconductor member having first conductivity type impurities is formed to partially fill the opening 115. The semiconductor member is formed by a selective epitaxial growth (SEG) process using the exposed portion of the substrate 100 as a seed layer.

A vertical cell diode 125 is formed in the semiconductor member within the opening 115 by doping an upper region 126 thereof with second conductivity type impurity ions while a lower region 128 of the semiconductor member has predominately first conductivity type impurity ions.

Referring to FIG. 1B, an ohmic layer 129 is formed within the opening 115 on the diode 125, such as by forming a metal silicide through the opening 115 on an upper surface of the diode 125.

Referring to FIG. 1C, an insulating spacer layer 130 is formed on upper surfaces of the insulation layer 112, sidewalls of the opening 115 above the ohmic layer 129, and on an upper surface of the ohmic layer 129. The spacer layer 130 is formed from silicon nitride at a temperature greater than 680° C. Referring to FIG. 1D, insulating spacers 135 are formed along sidewalls of the opening 115 by etching the spacer layer 130 to expose the upper surfaces of the insulation layer 112 and a portion of the ohmic layer.

Referring to FIG. 1E, a metal layer 142 is formed on the spacers 135 along sidewalls of the opening 115 and on the ohmic layer 129. A metal nitride layer 144 is formed on the metal layer 142 in the opening 115. The metal layer 142 and the metal nitride layer 144 serve as a first electrode layer 140.

Referring to FIG. 1F, an insulating filling layer is formed on the metal nitride layer 148 to fill a remaining portion of the opening 115. The filling layer may be formed at a temperature greater than 680° C. from silicon oxide or silicon nitride.

The filling layer and the first electrode layer 160 are etched to expose upper surfaces of the insulation layer 112. Etching the filling layer forms a filling member 155. Etching the first electrode layer 140 forms a cup-shaped first electrode 145 that includes a patterned metal layer 146 and patterned metal nitride layer 148.

Referring to FIG. 1G, a phase changeable material layer 170 is formed from a chalcogenide material on upper surfaces of the insulation layer 112, the filling member 155, and the first electrode 145. A conductive second electrode layer 180 is formed on the phase changeable material layer 170.

SUMMARY OF THE INVENTION

Various embodiments of the present invention are directed to methods of fabricating an integrated circuit memory cell. In some embodiments thereof, an ohmic layer is formed on an upper surface of a conductive structure and extends away from the structure along at least a portion of a sidewall of an opening in an insulation layer. An electrode layer is formed on the ohmic layer. A variable resistivity material is formed on the insulation layer and is electrically connected to the electrode layer.

In some further embodiments, the variable resistivity material includes a chalcogenide material. The ohmic layer can be formed on an upper surface of the structure and extend away from the structure along at least a major portion of a sidewall of the opening above the structure. The ohmic layer can be formed on an upper surface of the structure and extend away from the structure along at least 50% of a sidewall of the opening above the structure. The ohmic layer can be formed so that it entirely surrounds at least a major portion of sidewalls of the electrode layer within the opening.

In some further embodiments, the ohmic layer and the electrode layer can be formed at a same time. Formation of the ohmic layer can include forming a doped silicon layer on the upper surface of the structure and extending away from the structure along at least a portion of a sidewall of the opening, and forming a metal layer on the doped silicon layer to form a metal silicide layer along an interface between the metal layer and the doped silicon layer. The metal silicide layer serves as the ohmic layer and the metal layer serves as the electrode layer.

In some other embodiments thereof, an ohmic layer is formed on an upper surface of a conductive structure and extends away from the structure along at least a portion of a sidewall of an opening in an insulation layer. An upper portion of the ohmic layer in the opening is converted into an insulator. An electrode layer is formed in the opening on the ohmic layer. A variable resistivity material is formed on the insulation layer, on the insulator, and electrically connected to the electrode layer.

Some other embodiments are directed to integrated circuit memory cells. In some embodiments thereof, an integrated circuit memory cell includes: a substrate; a conductive structure on the substrate; an insulation layer with an opening that exposes the structure; a cup-shaped ohmic layer on the structure and that extends away from the structure along at least a portion of a sidewall of the opening; an electrode layer on sidewalls and bottom of an interior of the ohmic layer; and a variable resistivity material on the insulation layer and electrically connected to the electrode layer.

In some other embodiments, an integrated circuit memory cell includes: a substrate; a conductive structure on the substrate; an insulation layer with an opening that exposes the structure; a cup-shaped ohmic layer on the structure and that extends away from the structure along at least a portion of a sidewall of the opening; an insulator ring on an upper surface of the ohmic layer; an electrode layer on sidewalls and a bottom surface of an interior of the ohmic layer; and a variable resistivity material on the insulation layer and electrically connected to the electrode layer. The insulator ring insulates the variable resistivity material from the ohmic layer.

BRIEF DESCRIPTION OF THE DRAWINGS

The above and other features and potential advantages of the present invention will become readily apparent by reference to the following detailed description when considered in conjunction with the accompanying drawings wherein.

DETAILED DESCRIPTION

Figure 1A:
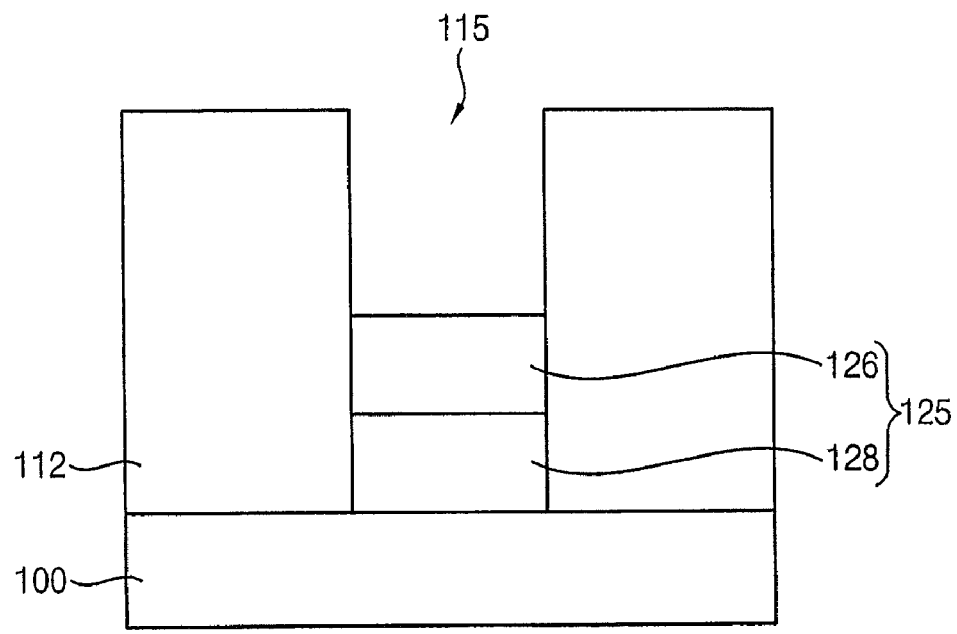
FIGS. 1A-G are cross-sectional views illustrating a conventional method of manufacturing a phase changeable memory device.
Figure 1B:
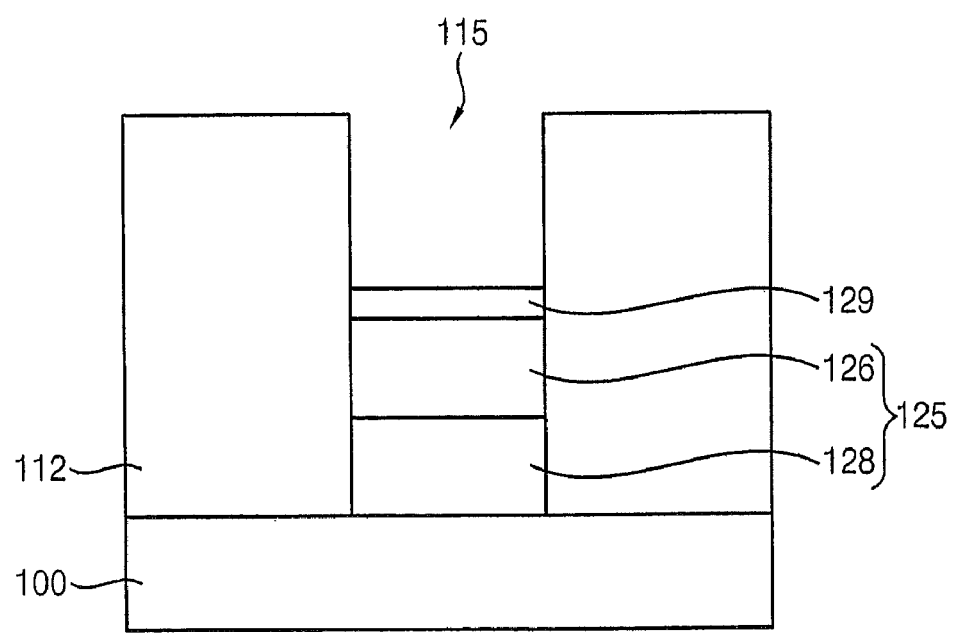

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein a cup-shaped electrode can have any cross-sectional shape with a recessed central portion. Such cross-section shapes of the electrode can include, but are not limited to, circular, oval, square, rectangular, combinations of arcuate and straight extending cross-section outlines, and/or irregular cross-sectional outlines.

Some embodiments of the invention may arise from a discovery that, in the conventional processes for fabricating the phase changeable memory device described above for FIGS. 1A-H, the high temperatures that are used when forming the filling member 155 and that are used when forming the sidewall spacer 135 in the opening 115 can damage the ohmic layer 129, such as by substantially degrading its thickness. The damage to the ohmic layer 129 can result in at least a 40% change in its resistance, which may result in degraded operational characteristics of the memory cells.

Figure 1C:
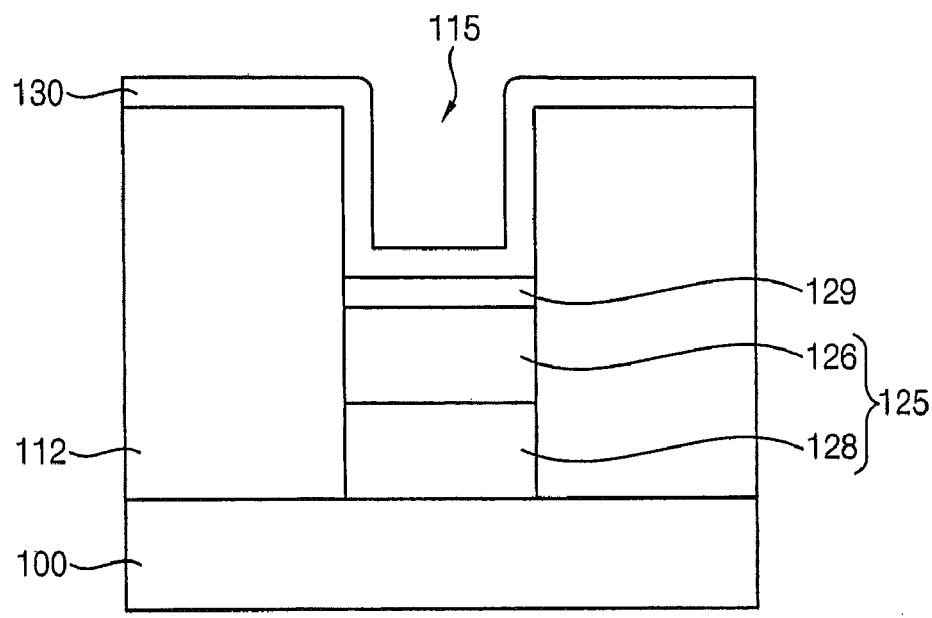
Figure 1D:
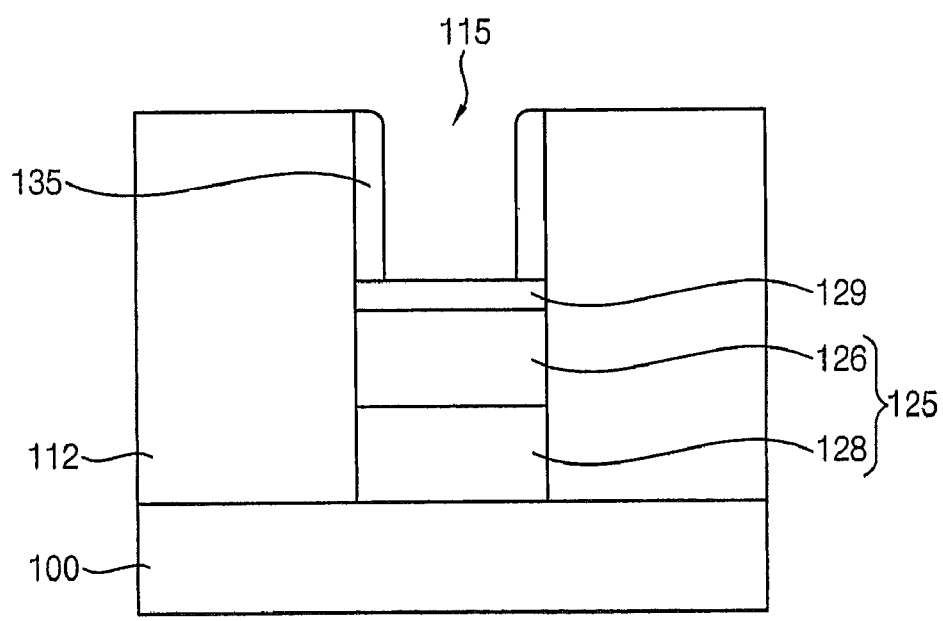
Figure 2:
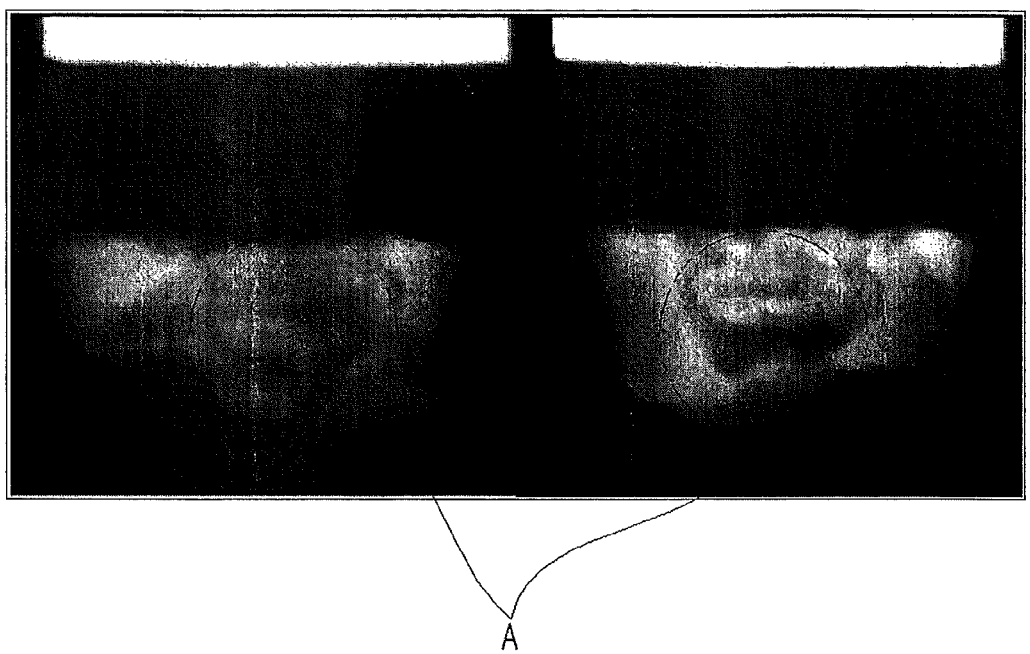
FIG. 2 is an electron microscope picture of an ohmic layer that has been damaged during formation of sidewall spacers using the conventional process of FIGS. 1C-D.

FIG. 2 is an electron microscope picture of an ohmic layer that has been damaged during formation of sidewall spacers using the conventional processes described above for FIGS. 1C-D. Referring to FIG. 2, it is observed that the ohmic layer exhibits degraded thickness, and associated degraded electrical characteristics, in the central regions labeled "A" due to etching processes that were used to, for example, etch the insulating spacer layer 130 of FIG. 1C to expose a central region of the ohmic layer 129 as shown in FIG. 1D. The degraded thickness of the ohmic region can increase the contact resistance between the ohmic layer and a first electrode layer that is formed thereon, which may degrade operational characteristics of a memory cell that is formed therefrom.

Figure 1E:
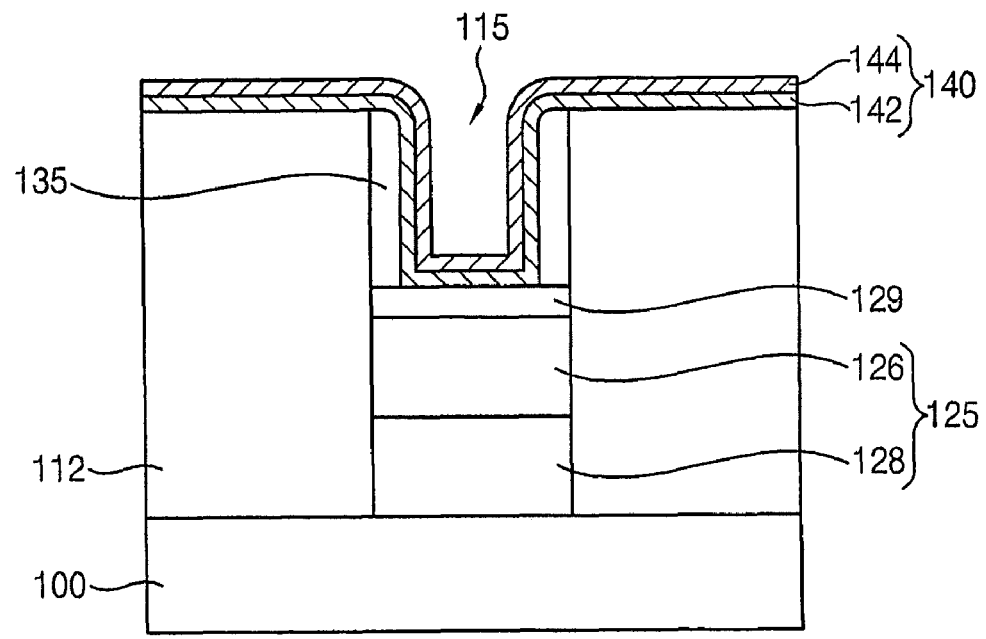
Figure 1F:
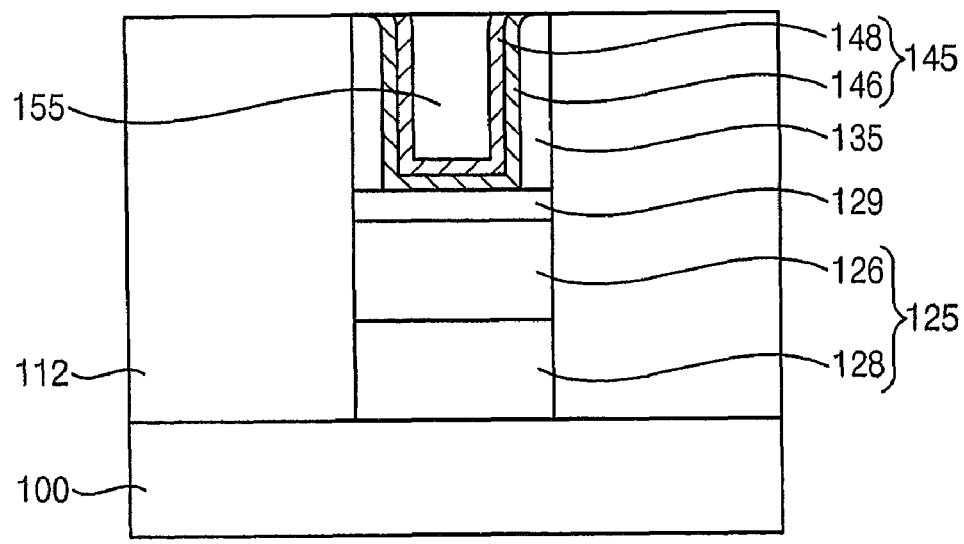
Figure 1G:
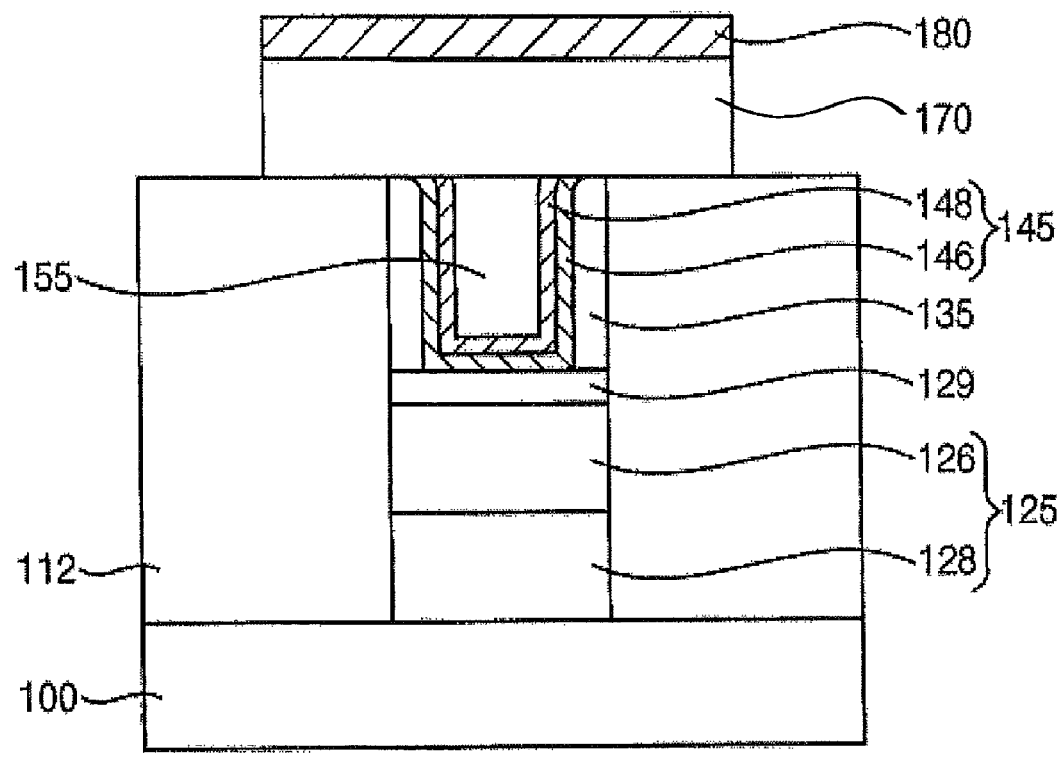

Moreover, as shown in FIGS. 1E-F, the contact area between the first electrode 145 and the ohmic layer 129 is limited to along the bottom surface of the cup-shaped electrode layer 140.

Some embodiments of the invention may alternatively or additionally arise from a discovery that the thickness of the insulating spacer layer 130, which can be silicon oxide and/or silicon nitride, along the sidewalls of the opening 115 in FIG. 1C may be difficult to control as the width of the opening 115 becomes smaller. Such variability in the width of the spacers 135 may result in a width therebetween that is insufficient for forming the first electrode 140 and the filling member 155.

Various embodiments of the present invention provide an ohmic layer not only along the bottom surface of a cup-shaped electrode layer, but also provide the ohmic layer along at least a portion of a sidewall of the electrode layer. In some embodiments, the ohmic layer entirely surrounds the electrode layer, and may be formed at the same time that the electrode layer is formed. The ohmic layer may therefore have an increased contact area with the electrode layer and may lower resistance therebetween, which may improve the operational characteristics of a memory cell that is formed therefrom. The ohmic layer may be formed by reacting a metal electrode layer with a doped silicon layer along an interface therebetween. In contrast to the insulating spacer layer 130 in FIGS. 1C-D, the thickness of the doped silicon layer may be more accurately controlled and which allow improved control of the thickness of the electrode layer and the filling member formed to fill an opening in an insulating layer.

Figure 3:
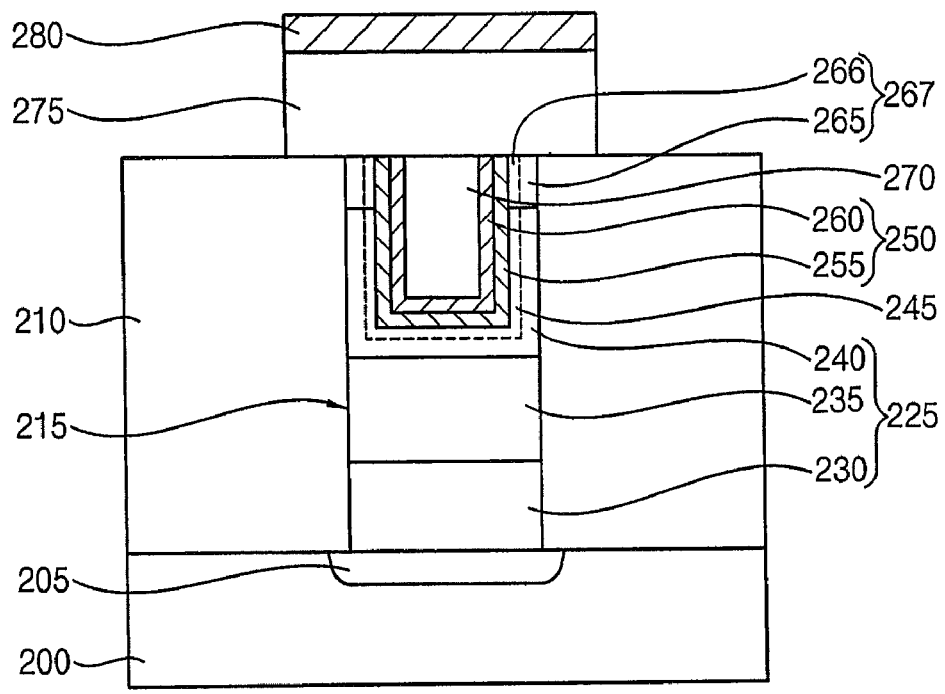
FIG. 3 is a cross sectional view illustrating an integrated circuit memory cell having a variable resistivity material that is electrically connected to a substrate through a conductive structure, which includes a vertical diode, in accordance with some embodiments of the present invention.

FIG. 3 is a cross sectional view illustrating an integrated circuit memory cell having a variable resistivity material that is electrically connected to a substrate 200 in accordance with some embodiments of the present invention. Referring to FIG. 3, the memory cell includes the substrate 200, of a first impurity type (e.g., P-type), with an impurity region 205, of an opposite second impurity type (e.g., N-type), defined therein. An insulation layer 210 is on the substrate 200 and has an opening 215 that is aligned with at least a portion of the impurity region 205. The insulation layer 210 may be formed from silicon oxide and/or silicon nitride. Although a single insulation layer 210 has been shown, it is to be understood that two or more insulation layers may alternatively be used.

A vertical diode in the opening 215 includes a lower diode region 230 having the second impurity type and an upper diode region 235 having the opposite first impurity type. A lower surface of the lower diode region 230 is on the impurity region 205, and the upper diode region 235 is on an upper surface of the lower diode region 230. A conductive doped silicon layer 240 (e.g., doped polysilicon) extends across an upper surface of the upper diode region 235 and upward along sidewalls of the opening 215. The upper and lower diode regions 230 and 235 and the doped silicon layer 240 form a conductive structure 225 that electrically connects the first electrode 250 to the impurity region 205.

A first electrode 250, which may be formed from metal, is on the doped silicon layer 240 and extends in a cup-shape across the upper diode region 235 and upward along the sidewalls of the opening 215. The first electrode 250 can include a metal layer 255 and a metal nitride layer 260 stacked on the doped silicon layer 240. The metal layer 255 can be formed on the doped silicon layer 240 so that it reacts with the doped silicon layer 240 to form an ohmic layer 245 along an interface therebetween.

For example, the metal layer 255 can be formed so as to react with the doped silicon layer 240 to form a metal silicide ohmic layer 245 along an interface therebetween. When the metal layer 255 includes titanium (Ti), the ohmic layer 245 may be formed as a titanium silicide (TiSix) layer. Alternatively, when the metal layer 255 includes cobalt (Co), the ohmic layer 245 may be formed as a cobalt silicide (CoSix) layer.

The diode layers 230 and 235 and the doped silicon layer 240 form the conductive structure 225 that electrically connects the impurity region 205 to the first electrode 250 through the ohmic layer 240.

A filling member 270 fills an interior of the first electrode 250. The filling member 270 may be formed from a nitride, such as silicon nitride. The filling member 270 may additionally or alternatively be formed from doped and/or undoped silicon, and an upper portion thereof may been changed to have insulative properties by, for example: introducing nitrogen into an upper portion of the doped/undoped silicon filling member 270; oxidizing an upper portion of the doped/undoped silicon filling member 270; and/or recessing an upper portion of the doped/undoped silicon filling member 270 and then filling the recessed portion with an insulative material (e.g., silicon nitride and/or silicon oxide).

An upper portion of the doped silicon layer 240 and the ohmic layer 245 is changed to have insulative properties by, for example: introducing nitrogen into an upper portion of the doped silicon layer 240 and the ohmic layer 245; oxidizing an upper portion of the doped silicon layer 240 and the ohmic layer 245; and/or recessing the upper portion of the doped silicon layer 240 and the ohmic layer 245 and depositing and patterning thereon an insulative material (e.g., silicon nitride and/or silicon oxide).

A variable resistivity material layer 275 is on an upper surface of the insulation layer 210, the insulative upper portion of the doped silicon layer 240 and the ohmic layer 245, the filling member 270, and is electrically connected to the first electrode 250. The variable resistivity material layer 280 may include a phase changeable material such as a chalcogenide material that includes, for example, germanium (Ge), antimony (Sb), and/or tellurium (Te). A second electrode 280 is formed on the variable resistivity material layer 275.

Accordingly, the variable resistivity material layer 275 is electrically connected between the first and second electrodes 250 and 280. The first electrode 250 is electrically connected to the impurity region 205 through the ohmic layer 245, the doped silicon layer 240, and the upper and lower diode regions 235 and 230.

With continuing reference to FIG. 3, it is observed that the ohmic layer 245 surrounds the cup-shaped first electrode 250, which provides greater contact surface area and lower resistance between the ohmic layer 245 and the cup-shaped first electrode 250. The much larger electrical conduction area between the first electrode 250 and the upper diode region 235 through the ohmic layer 245 compared to that between the upper surface of the electrode 250 and the variable resistivity material layer 275, may provide a much lower resistance between the first electrode 250 and the upper diode region 235 than between the first electrode 250 and the variable resistivity material layer 275. Moreover, because the layer 245 is formed from doped silicon, its thickness may be more easily controlled then the conventional spacers 135 in FIG. 1G formed from silicon oxide or silicon nitride. Moreover, the bottom surface of the cup-shaped first electrode 250 contacts a relatively large area of the ohmic layer 249 and the upper surfaces of sidewalls of the cup-shaped first electrode 250 contact a relatively small area of the variable resistivity material layer 280. These and other aspects of the structure may provide improved operational characteristics for the memory cell of FIG. 3.

Figure 4:
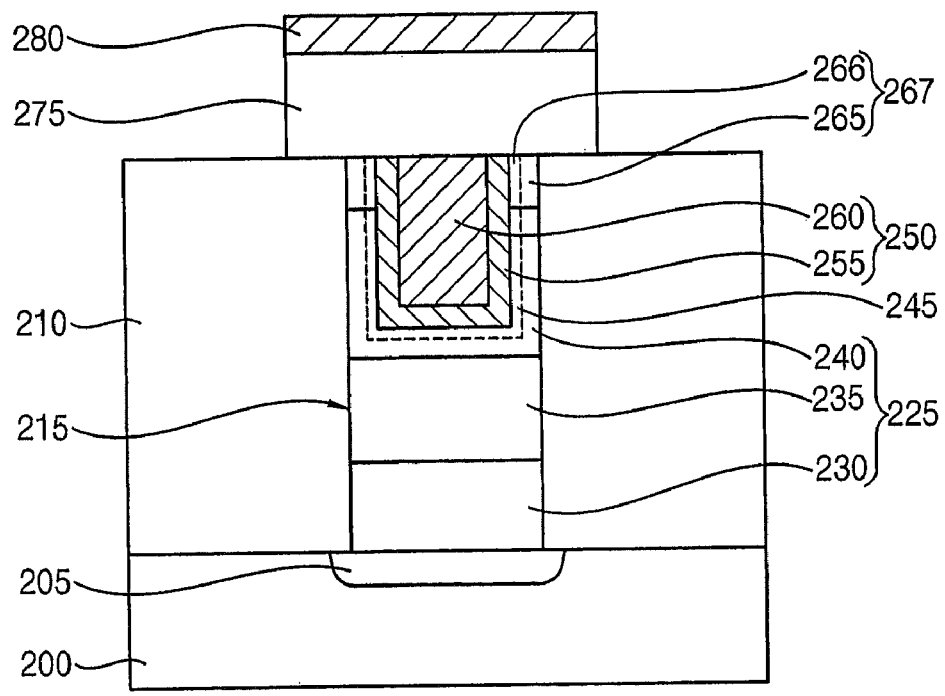
FIG. 4 is a cross sectional view illustrating an integrated circuit memory cell having a variable resistivity material that is electrically connected to a substrate through a conductive structure, which includes a vertical diode, in accordance with some other embodiments of the present invention.

FIG. 4 is a cross sectional view illustrating an integrated circuit memory cell having a variable resistivity material that is electrically connected to a substrate 200 through a conductive contact 225, which includes a vertical diode, in accordance with some embodiments of the present invention. The memory cell of FIG. 4 contains many of the same elements as the memory cell of FIG. 3, except that the cup-shaped first electrode is configured differently, as will be described below. The description of the same elements is not repeated here for brevity.

Referring to FIG. 4, a cup-shaped first electrode 250 is electrically connected between an ohmic layer 245 and a variable resistivity material layer 275. The first electrode 250 includes a metal layer 255 and a metal nitride layer 260. In contrast to the first electrode of FIG. 3, in the first electrode 250 of FIG. 4, the metal nitride layer 260 fills an interior of the first electrode 250, thereby avoiding the need to use a filling member (e.g., the filling member 270 of FIG. 3).

Figure 5:
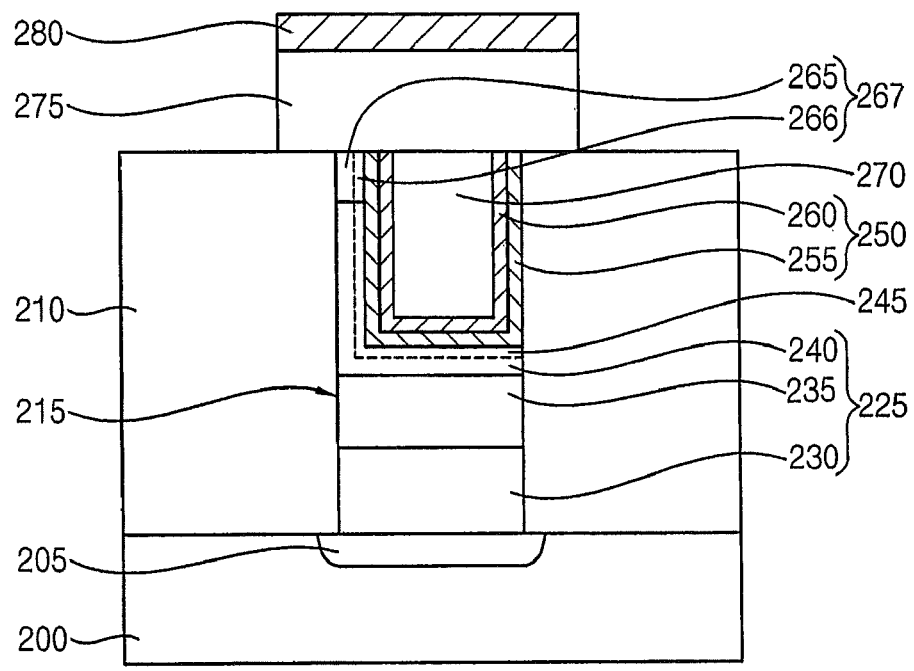
FIG. 5 is a cross sectional view illustrating an integrated circuit memory cell having a variable resistivity material that is electrically connected to a substrate through a conductive structure, which includes a vertical diode, in accordance with some embodiments of the present invention.

FIG. 5 is a cross sectional view illustrating an integrated circuit memory cell having a variable resistivity material that is electrically connected to a substrate 200 through a conductive contact 225, which includes a vertical diode, in accordance with some embodiments of the present invention. The memory cell of FIG. 5 contains many of the same elements as the memory cell of FIG. 3, except that a cup-shaped first electrode of FIG. 5 is positioned differently within an opening in an insulation layer, as will be described below. The description of the same elements is not repeated here for brevity.

Referring to FIG. 5, a conductive doped silicon layer 240 extends across the upper surface of the upper diode region 235 and upward along some, but not all, sidewalls of the opening 215. Accordingly, a major portion of one of the sidewalls of the opening 215 above the upper diode region 235 remains exposed after the doped silicon layer 240 is formed.

A first electrode 250 is formed on the doped silicon layer 240, extending with a cup-shape across the upper diode region 235 and upward along the sidewalls of the opening 215, and upward directly on the exposed at least one sidewall of the opening 215. The first electrode 250 includes a stacked metal layer 255 and metal nitride layer 260. The metal layer 255 can be formed on the doped silicon layer 240 so that it reacts with the doped silicon layer 240 to form an ohmic layer 245 along an interface therebetween. Accordingly, the ohmic layer 245 is between the first electrode 250 and the doped silicon layer 240 extending across the upper diode region 235 and upward along some, but not all, sidewalls of the opening 215.

A filling member 270 fills an interior of the first electrode 250. An upper portion 265 of the doped silicon layer 265 and the ohmic layer 266 is changed to have insulative properties by, for example: introducing nitrogen into the doped silicon layer upper portion 265 and into the ohmic layer upper portion 266; oxidizing the doped silicon layer upper portion 265 and the ohmic layer upper portion 266; and/or recessing the doped silicon layer upper portion 265 and the ohmic layer upper portion 266 and depositing and patterning thereon an insulative material (e.g., silicon nitride and/or silicon oxide).

A variable resistivity material layer 275 is on an upper surface of the insulation layer 210, the insulative doped silicon layer upper portion 265 and the ohmic layer upper portion 266, the filling member 270, and is electrically connected to the first electrode 250. A second electrode 280 is formed on the variable resistivity material layer 275.

Figure 6:
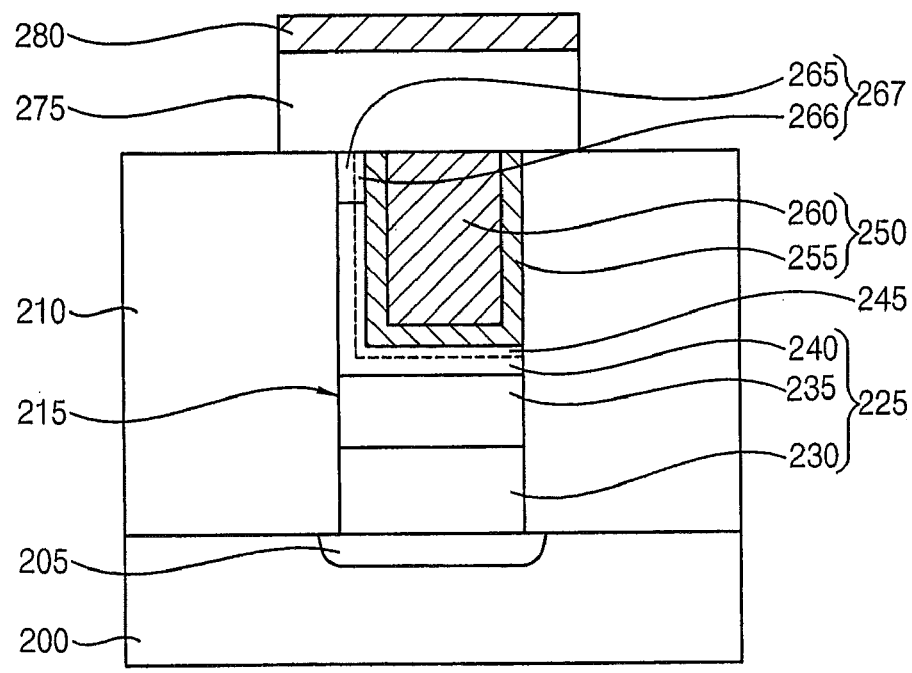
FIG. 6 is a cross sectional view illustrating an integrated circuit memory cell having a variable resistivity material that is electrically connected to a substrate through a conductive structure, which includes a vertical diode, in accordance with some other embodiments of the present invention.

FIG. 6 is a cross sectional view illustrating an integrated circuit memory cell having a variable resistivity material that is electrically connected to a substrate 200 through a conductive contact 225, which includes a vertical diode, in accordance with some embodiments of the present invention. The memory cell of FIG. 6 contains many of the same elements as the memory cell of FIG. 5, except that its cup-shaped first electrode is configured differently, as will be described below. The description of the same elements is not repeated here for brevity.

Referring to FIG. 6, a cup-shaped first electrode 250 is electrically connected between an ohmic layer 245 and a variable resistivity material layer 275. As described with regard to FIG. 5, the first electrode 250 directly contacts at least one sidewall of the opening 215.

The first electrode 250 includes a metal layer 255 and a metal nitride layer 260. In contrast to the first electrode 250 of FIG. 5, in the first electrode 250 of FIG. 6 the metal nitride layer 260 fills an interior of first electrode 250, thereby avoiding the need to use a filling member (e.g., the filling member 270 of FIG. 5). By filling the interior of the cup-shaped metal layer 255 with metal nitride, which serves as an electrical insulator, a relatively small electrical contact area is provided between the first electrode 250 and the variable resistivity material 275 through the upper surface of the metal layer 255.

FIGS. 7A-I are cross-sectional views illustrating methods of fabricating integrated circuit memory cells, such as the memory cells of FIGS. 3 and 4, in accordance with some embodiments of the present invention.

Figure 7A:
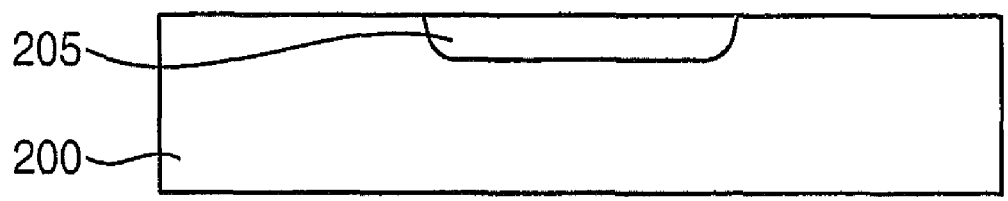
FIGS. 7A-I are cross-sectional views illustrating methods of fabricating integrated circuit memory cells, such as the memory cells of FIGS. 3 and 4, in accordance with some embodiments of the present invention.
Figure 7B:
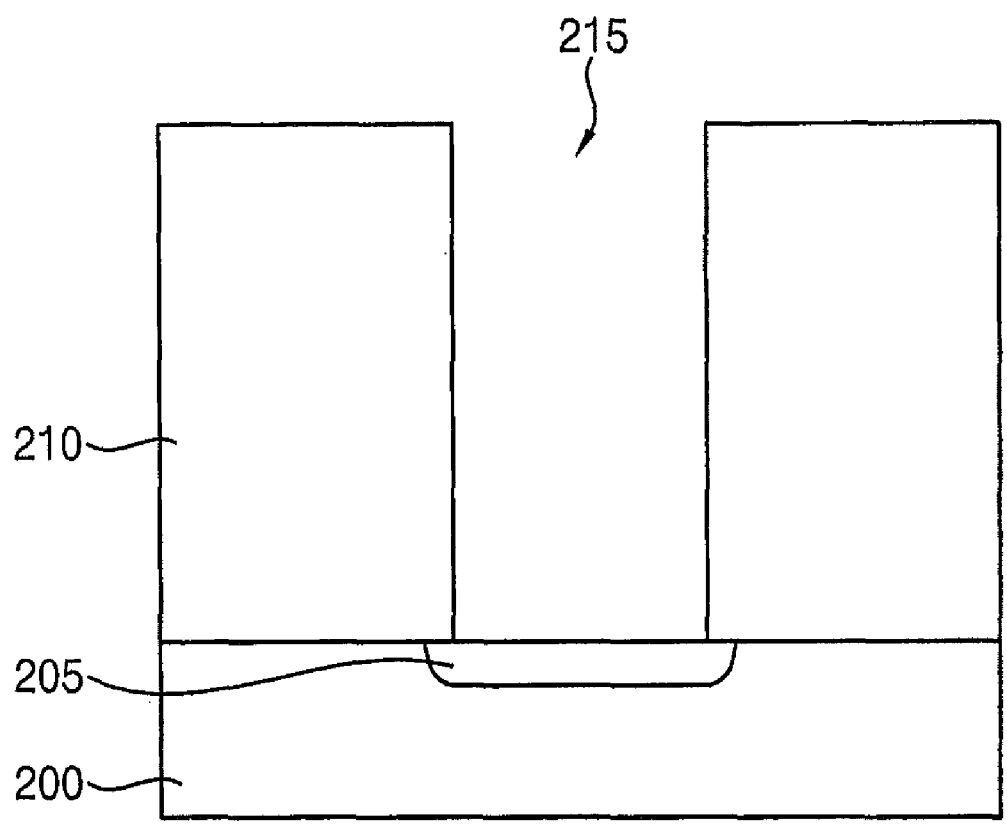

Referring to FIGS. 7A-B, an impurity region 205 is formed by implanting impurity ions into the semiconductor substrate 200. An insulation layer 210 is formed on the substrate 200 and the impurity region 205. The insulation layer 210 may be formed from silicon oxide and/or silicon nitride. The insulation layer 210 is patterned to form an opening 215 that exposes at least a portion of the impurity region 205. For example, a mask may be formed on the insulation layer 210 to define a location for the opening 215, and the opening 215 may be etched through the insulation layer 210 using the mask. Although a single insulation layer 210 has been shown, it is to be understood that more than one insulation layer may alternatively be used.

Figure 7C:
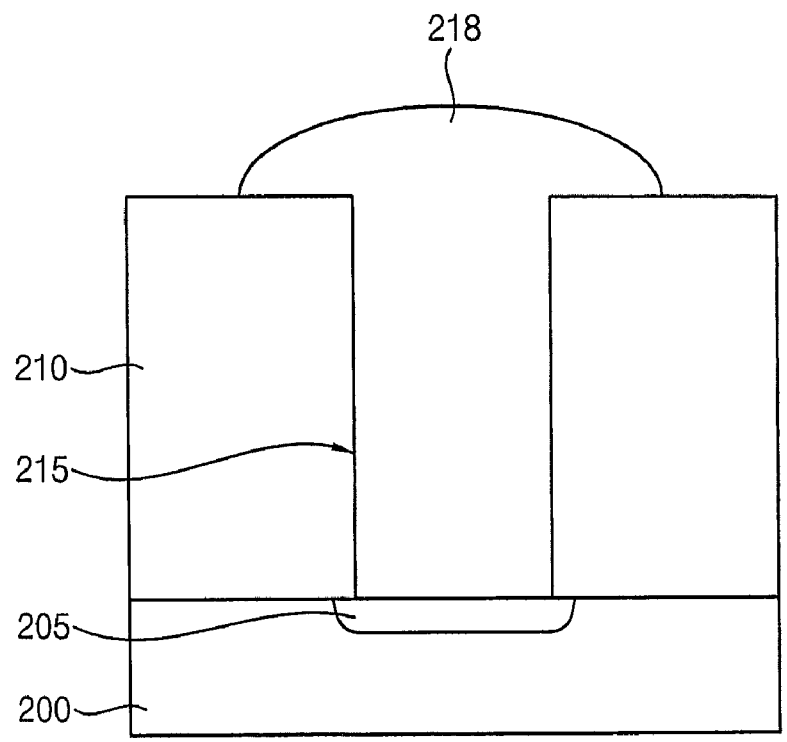
Figure 7D:
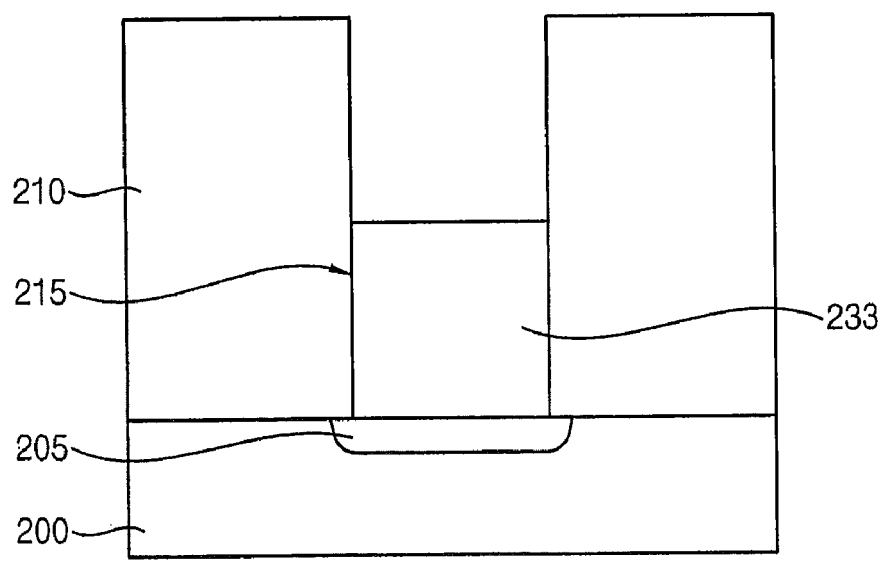

Referring to FIGS. 7C-D, a silicon layer 218 is formed to at least partially fill the opening 215, such as by a selective epitaxial growth (SEG) process that uses the exposed impurity region 205 as a seed layer and/or by depositing the silicon layer 218 in the opening 215. The silicon layer 218 is recessed in the opening 215, such as by etching-back the silicon layer 218, to form a recessed silicon layer 233.

Figure 7E:
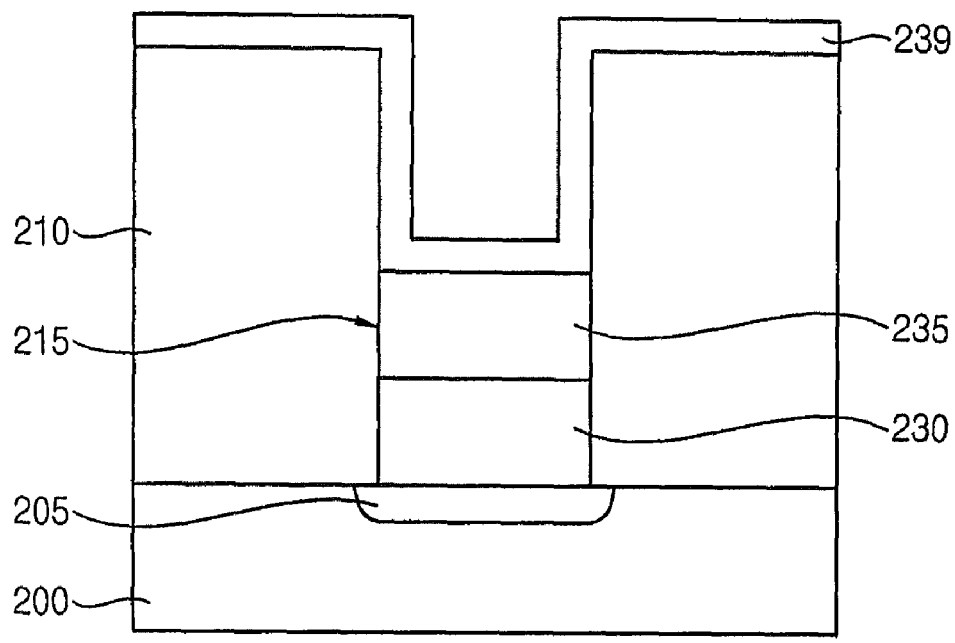

Referring to FIG. 7E, a vertical cell diode is formed in the recessed silicon layer 233 by implanting or otherwise providing first conductivity type impurity ions (e.g., n-type ions) in a lower diode region 230 of the recessed silicon layer 233, and implanting or otherwise providing second conductivity type impurity ions (e.g., p-type ions), which are opposite to the first conductivity type impurity ions, in an upper diode region 235 of the recessed silicon layer 233. A doped silicon layer 239 is formed on upper surfaces of the insulation layer 210 and along sidewalls of the opening 215 and the upper diode region 235.

Figure 7F:
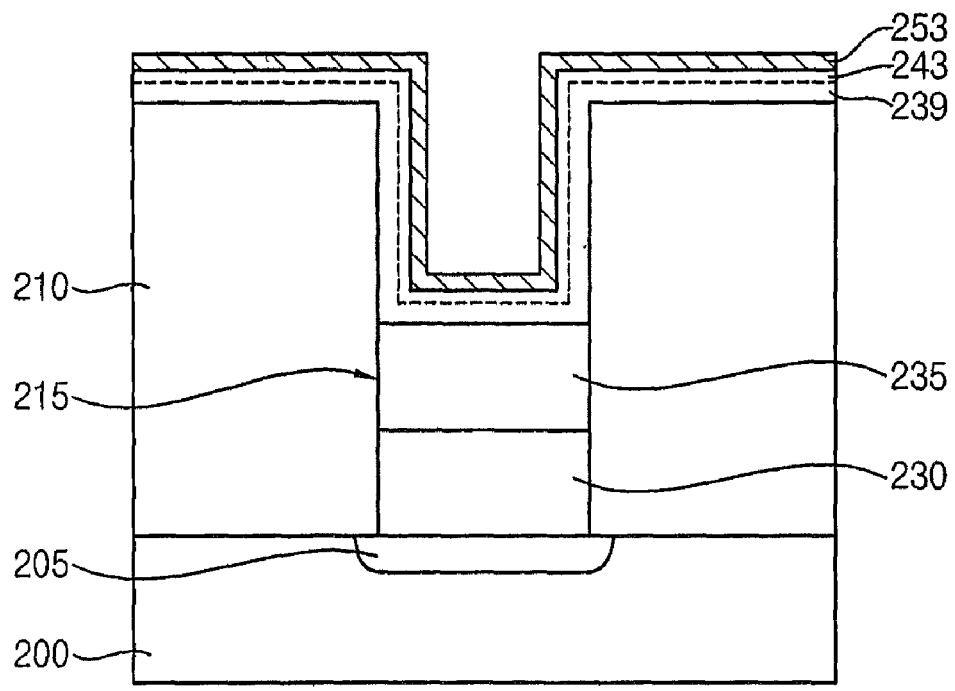

Referring to FIG. 7F, a metal layer 253 is formed, such as by being deposited, on the doped silicon layer 239, including along the sidewalls of the opening 217 and across the upper diode region 235. The metal layer 253 can be formed so as to react with the doped silicon layer 239 to form a metal silicide ohmic layer 243 along an interface therebetween. When the metal layer 253 includes titanium (Ti), the ohmic layer 243 may be formed as a titanium silicide (TiSix) layer. Alternatively, when the metal layer 253 includes cobalt (Co), the ohmic layer 243 may be formed as a cobalt silicide (CoSix) layer.

Figure 7G:
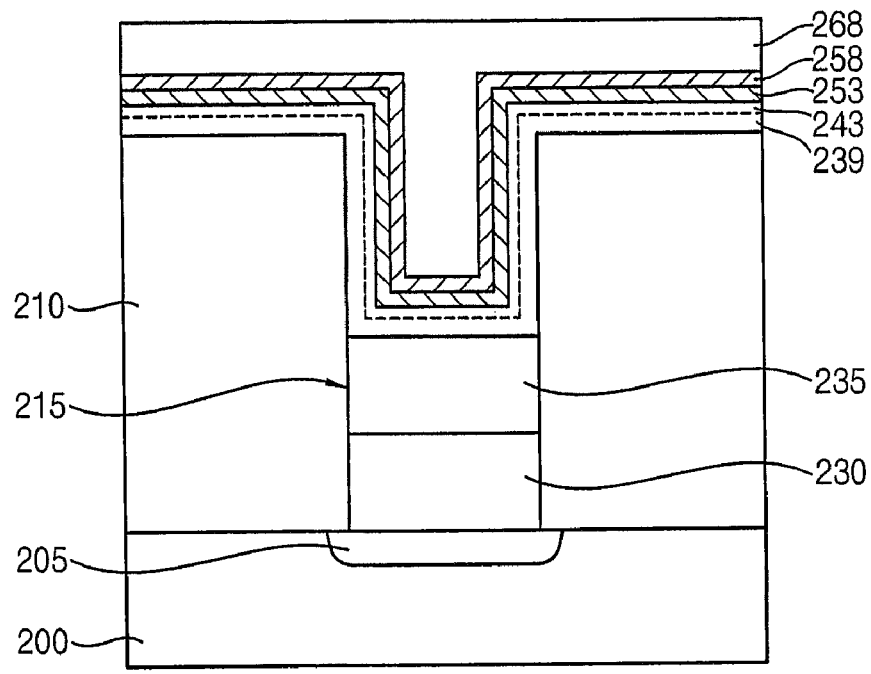

Referring to FIG. 7G, a metal nitride layer 258 is formed, such as by being deposited, on the metal layer 235. A filling layer 268 is formed on the metal nitride layer 258 and fills the opening 215 above the metal nitride layer 258. The metal nitride layer 260 can serve as an electrical insulator between the metal layer 258 and the filling layer 268.

Figure 7H:
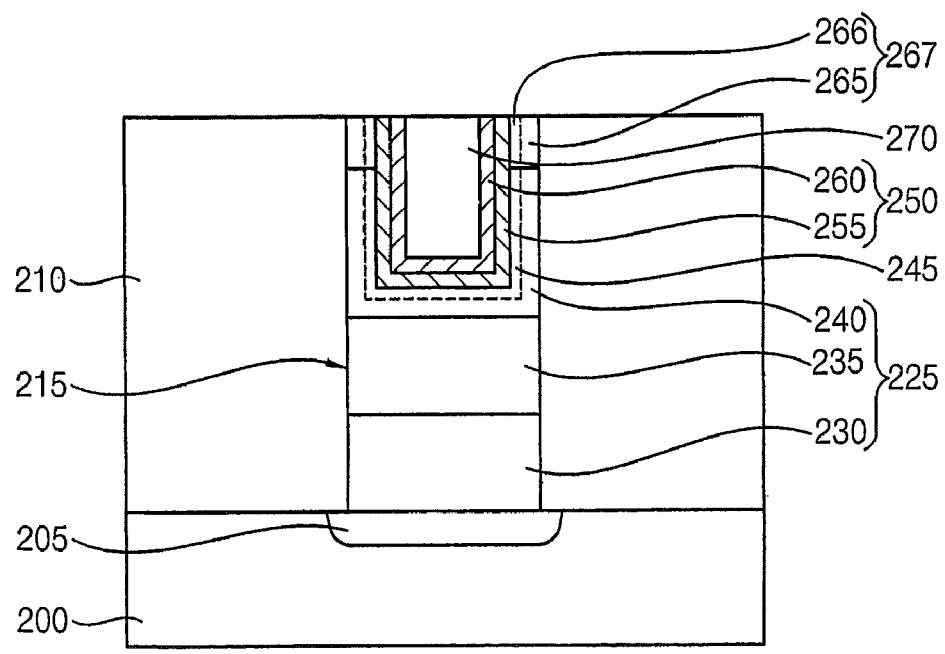

Referring to FIG. 7H, the filling layer 268, the metal nitride layer 258, the metal layer 253, the ohmic layer 243, and the doped silicon layer 239 are etched to expose upper surfaces of the insulation layer 210 and, thereby, form a filling member 270, a metal nitride layer 260, a metal layer 255, an ohmic layer 245, and a doped silicon layer 240 with an opening 215 above the upper and lower diode regions 235 and 230. The upper and lower diode regions 235 and 230 form a conductive structure 225 that electrically connects the first electrode 250 to the impurity region 205.

An upper portion 267 of the doped silicon layer 240 and the ohmic layer 245 is changed to have insulative properties by, for example: introducing nitrogen into a doped silicon layer upper portion 265 and an ohmic layer upper portion 266; oxidizing the doped silicon layer upper portion 265 and the ohmic layer upper portion 266; and/or recessing the doped silicon layer upper portion 265 and the ohmic layer upper portion 266 and depositing thereon an insulative material (e.g., silicon nitride and/or silicon oxide).

Figure 7I:
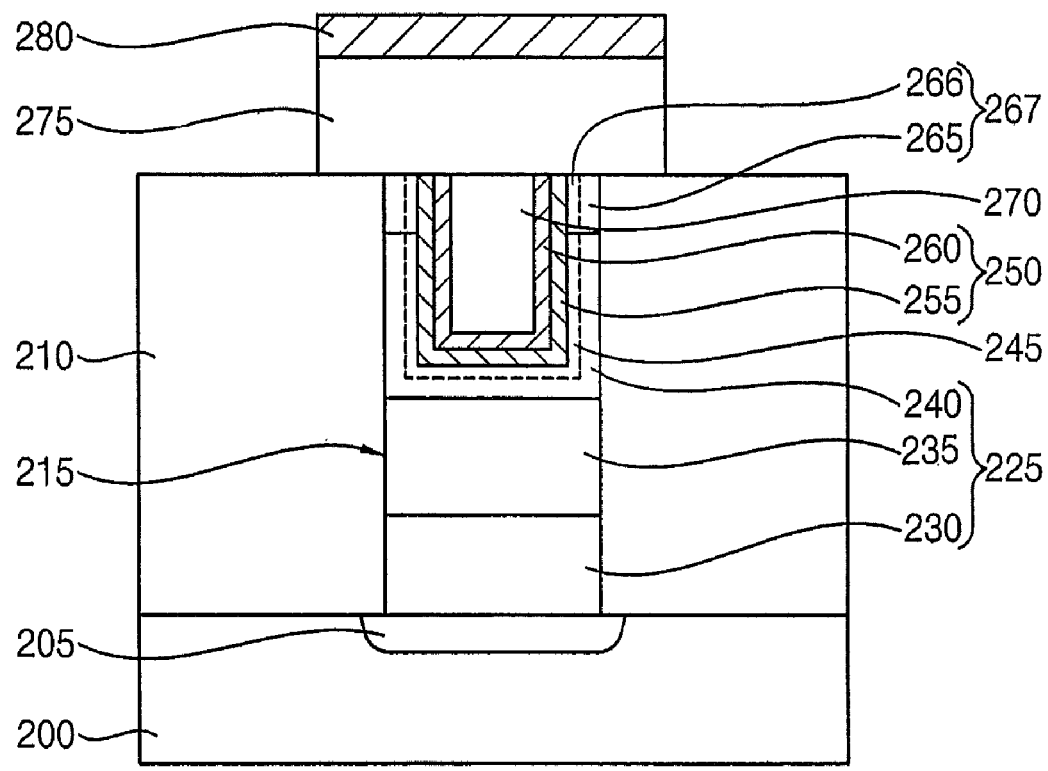

Referring to FIG. 7I, a variable resistivity material layer 275 is formed on an upper surface of the insulation layer 210, the insulative upper portion 267 of the doped silicon layer 240 and the ohmic layer 245, the filling member 270, and is electrically connected to the first electrode 250. The variable resistivity material layer 280 may include a phase changeable material such as a chalcogenide material that includes, for example, germanium (Ge), antimony (Sb), and/or tellurium (Te). A second electrode 280 is formed on the variable resistivity material layer 275.

Accordingly, the variable resistivity material layer 275 is electrically connected between the first and second electrodes 250 and 280, and the first electrode 250 is electrically connected to the impurity region 205 through the ohmic layer 245 and the conductive structure that includes the doped silicon layer 240 and the upper and lower diode regions 235 and 230.

With continuing reference to FIG. 7I, the ohmic layer 245 surrounds the cup-shaped first electrode 250, which provides greater contact surface area, and lower resistance, between the ohmic layer 245 and the cup-shaped first electrode 250. The much larger electrical conduction area between the first electrode 250 and the diode 225 through the ohmic layer 245 relative to the electrical conduction area between the upper surface of the electrode 250 and the variable resistivity material layer 275, provides a much lower resistance between the first electrode 250 and the upper and lower diode regions 235 and 230 than between the first electrode 250 and the variable resistivity material layer 275. Moreover, because the layer 245 is formed from doped silicon, its thickness may be more easily controlled then the conventional spacers 135 in FIG. 1G formed from silicon oxide or silicon nitride. Moreover, because the bottom surface of the cup-shaped first electrode 250 contacts a relatively large area of the ohmic layer 249 and the upper surfaces of sidewalls of the cup-shaped first electrode 250, the contact the variable resistivity material layer 280. These and other aspects of the structure may provide improved operational characteristics for the memory cell of FIG. 7I.

Figure 8:
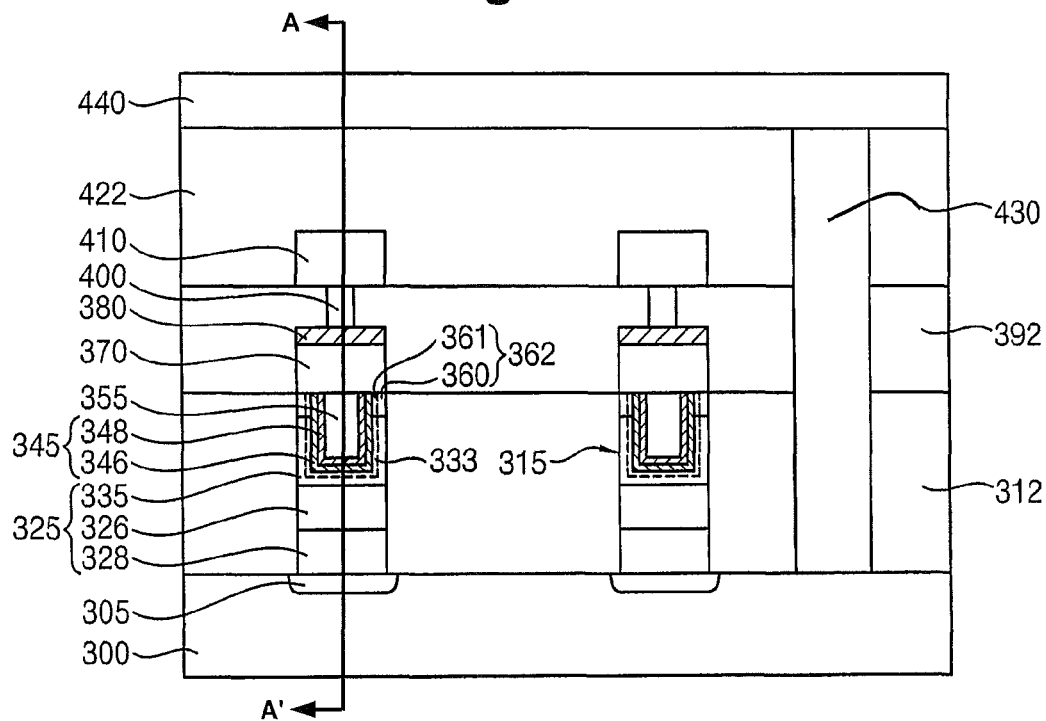
FIG. 8 is a cross-sectional view illustrating a diode type PRAM device in accordance with some embodiments of the present invention.

FIG. 8 is a cross-sectional view illustrating a diode type PRAM device, which may include the memory cell of FIG. 3, in accordance with some embodiments of the present invention. Referring to FIG. 8, a first insulation layer 312 is on a substrate 300. Impurity regions 305 are formed in the substrate 300. First electrodes 345 are electrically connected to the impurity regions 305 through a combination of conductive structures 325 and ohmic layers 333. Each of the conductive structures 325, the ohmic layers 333, the first electrodes 345, and filling members 355 can be configured as was described above for FIG. 3 for the corresponding conductive contact 225, ohmic layer 245, first electrode 250, and filling member 270, the description of which is not repeated here for brevity.

Variable resistivity material layers 370 are electrically connected between second electrodes 380 and the first electrodes 345. A second insulation layer 392 is on the first insulation layer 312 and extends across the second electrodes 380 and a variable resistivity material layers 370. Conductive lines 410, which may be bit lines, are on the second insulation layer 392. Conductive contacts 380 extend between the conductive lines 410 and the second electrodes 380 through a portion of the second insulation layer 392.

A third insulation layer 422 is on the second insulation layer 392 and extends across the conductive lines 410. A conductive line 440, which may be a word line, is on the third insulation layer 422. A conductive contact 430 extends between the conductive line 440 and an active region of the substrate 300 through the first insulation layer 312, the second insulation layer 392, and the third insulation layer 422.

Figure 9:
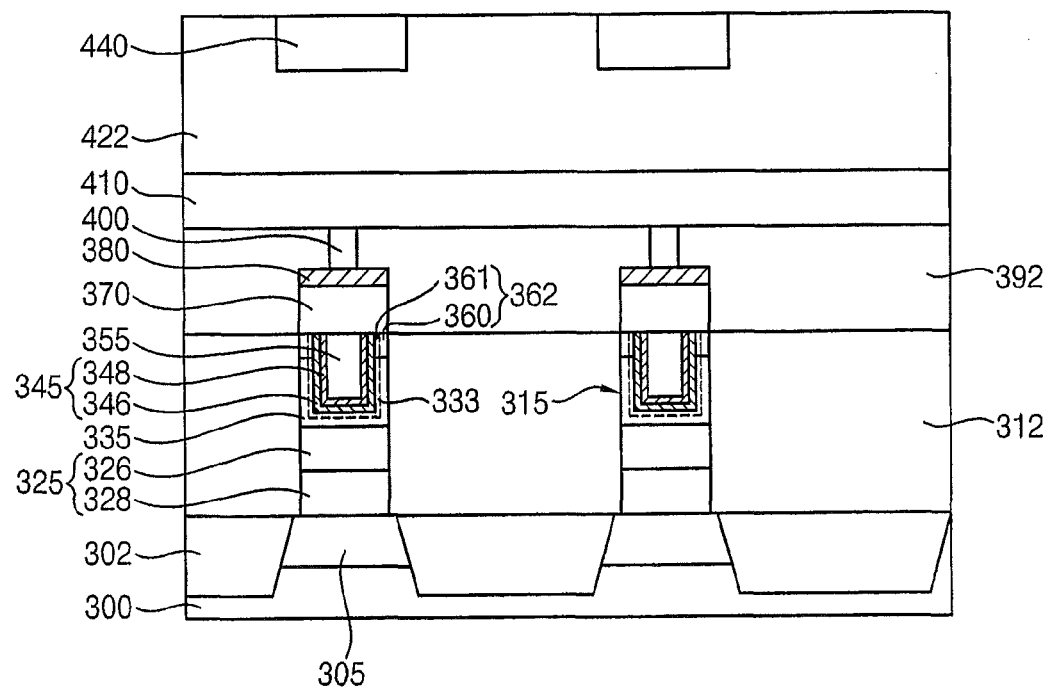
FIG. 9 is a cross-sectional view along line A-A through the diode type PRAM device of FIG. 8 in accordance with some embodiments of the present invention.

FIG. 9 is a cross-sectional view along line A-A through the diode type PRAM device of FIG. 8 in accordance with some embodiments of the present invention.

Figure 10:
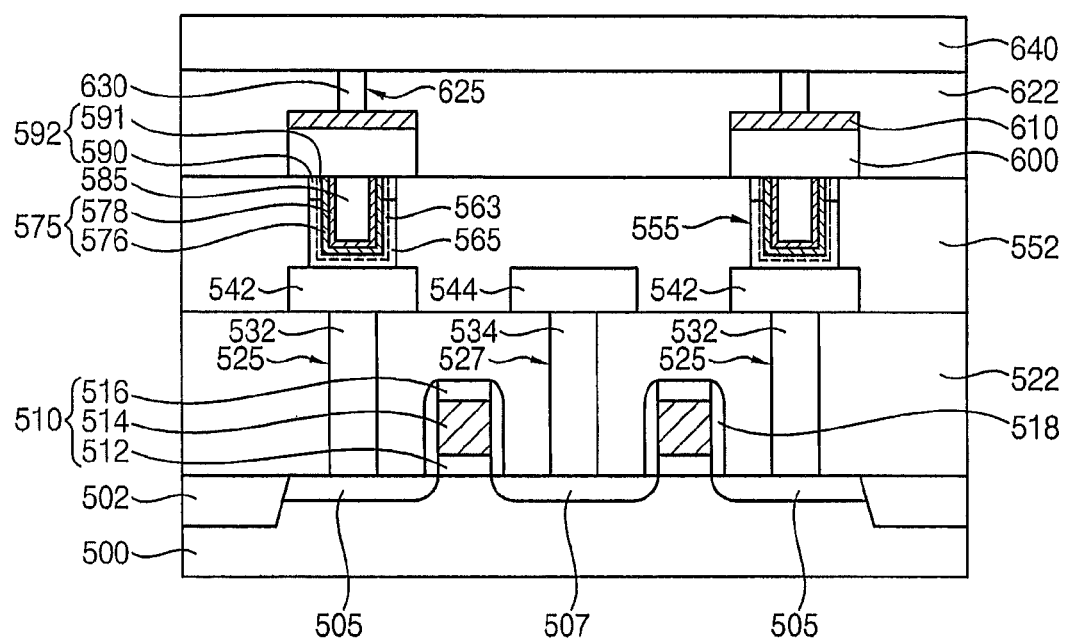
FIG. 10 is a cross-sectional view illustrating a transistor type PRAM device in accordance with some embodiments of the present invention.

FIG. 10 is a cross-sectional view illustrating a transistor type PRAM device in accordance with some embodiments of the present invention. The transistor type PRAM device of FIG. 10 includes a variable resistivity material layer that is electrically connected to a terminal of a transistor. With reference to FIG. 10, source and drain regions, 505 and 507, are formed between isolation regions 502 in a substrate 500. Gate structures 510 are on channel regions in the substrate 500 between the source and drain regions, 505 and 507. The gate structures 510 may each include a capping layer 516, a gate 514, and a tunneling insulation layer 512. Sidewall spacers 518 are between sidewalls of the gate structures 510 and a first insulation layer 522. The first insulation layer 522 is on and extends across the isolation regions 502, the source and drain regions, 505 and 507, and the gate structures 510.

Conductive contacts 532 extend through openings 525 in the first insulation layer 522 to contact one type of the source and drain regions, 505 and 507. Contact pads 542 are on the contacts 532 and an upper surface of the first insulation layer 522. Another conductive contact 534 extends through an opening 527 in the first insulation layer 522 to contact another type of the source and drain regions, 505 and 507. A conductive line 544 is formed on the conductive contact 534.

A second insulation layer 552 is on and extends across the first insulation layer 522, the conductive pads 542, and the conductive line 544. Openings 555 in the second insulation layer 552 expose at least a portion of the conductive pads 542.

A doped silicon layer 565, and ohmic layer 563, a electrode 575, and a filling member 585 are formed in the openings 555. The doped silicon layer 565, the ohmic layer 563, the electrode 575, and the filling member 585 can be configured as was described above for FIG. 3 for the corresponding doped silicon layer 240, the ohmic layer 245, the electrode 250, and the filling member 270, the description of which is not repeated here for brevity.

Variable resistivity material layers 600 are electrically connected between second electrodes 610 and the first electrodes 575. A third insulation layer 622 is on the second insulation layer 552 and extends across the second electrodes 610. A conductive line 640 is on the third insulation layer 622. Conductive contacts 630 extend through openings 625 in the third insulation layer 622 to interconnect the conductive line 640 and the second electrodes 610.

FIGS. 11A-J are cross-sectional views illustrating methods of fabricating diode type PRAM devices, such as the diode type PRAM device of FIG. 8, in accordance with some embodiments of the present invention.

The methods and resulting structures shown in FIGS. 11A-G can be the same as those shown in FIGS. 7A-I, with the exception that in FIGS. 11A-G two of the devices shown in FIGS. 7A-I are fabricated. Accordingly, the description provided above for FIGS. 7A-I is incorporated herein as a description of the structure and methods of FIGS. 11A-G and is not repeated for brevity.

Figure 11A:
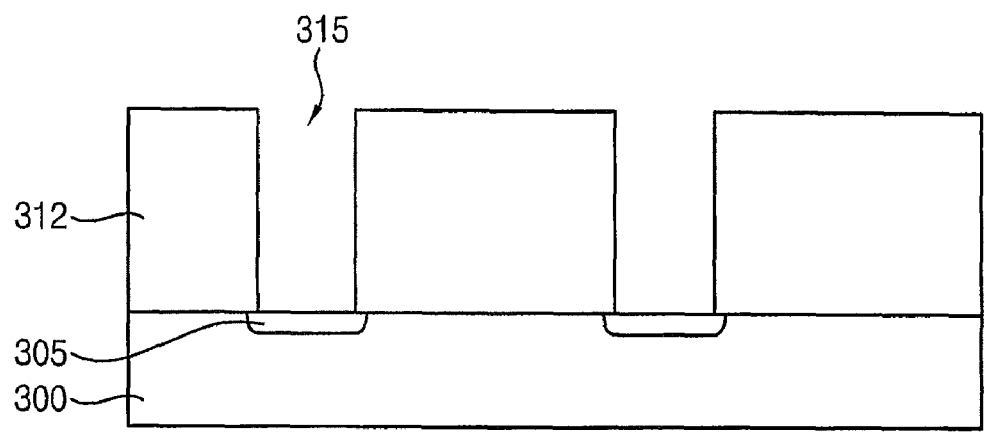
FIGS. 11A-J are cross-sectional views illustrating methods of fabricating diode type PRAM devices, such as the diode type PRAM device of FIG. 8, in accordance with some embodiments of the present invention.
Figure 11B:
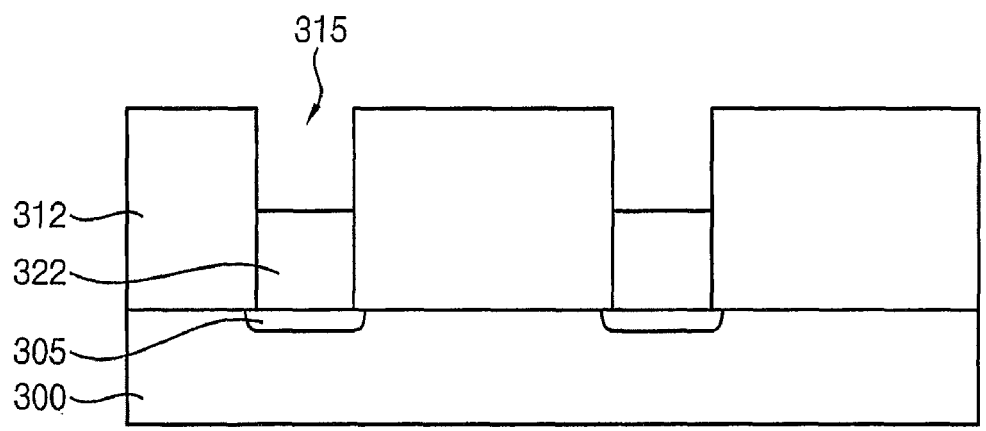
Figure 11C:
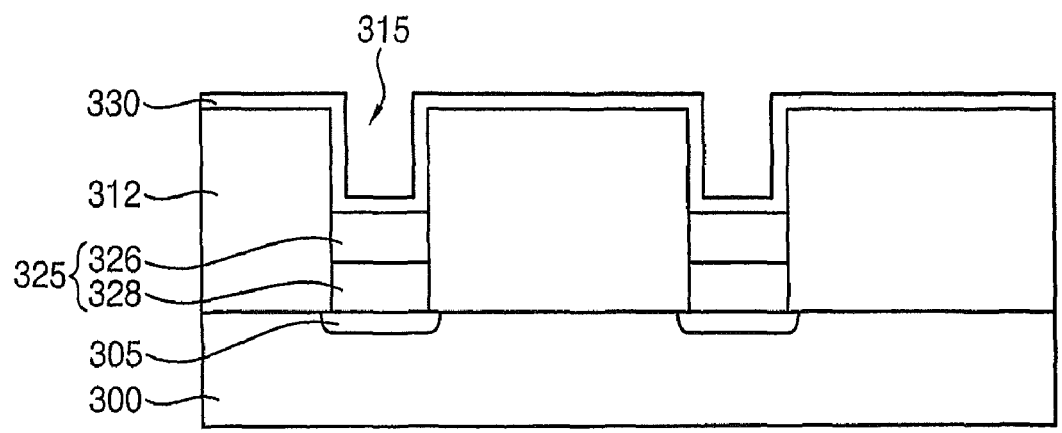
Figure 11D:
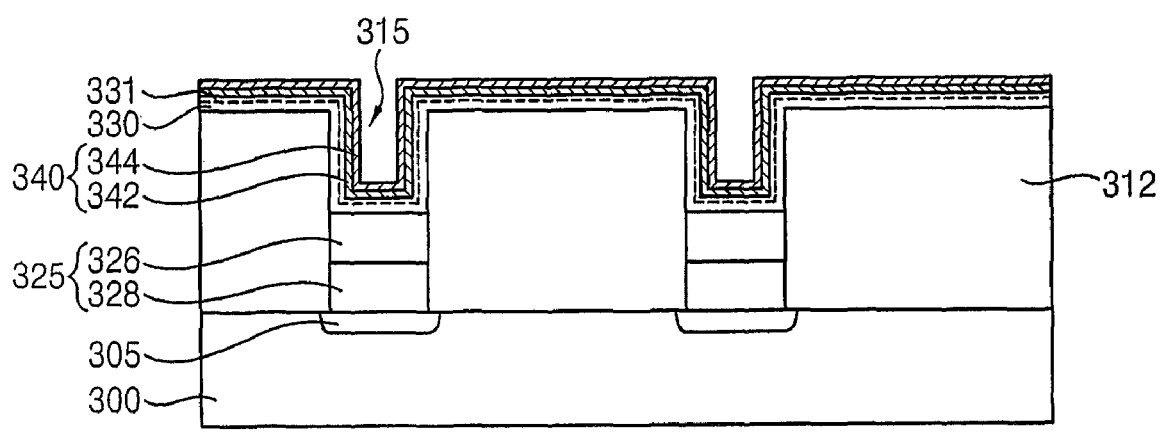
Figure 11E:
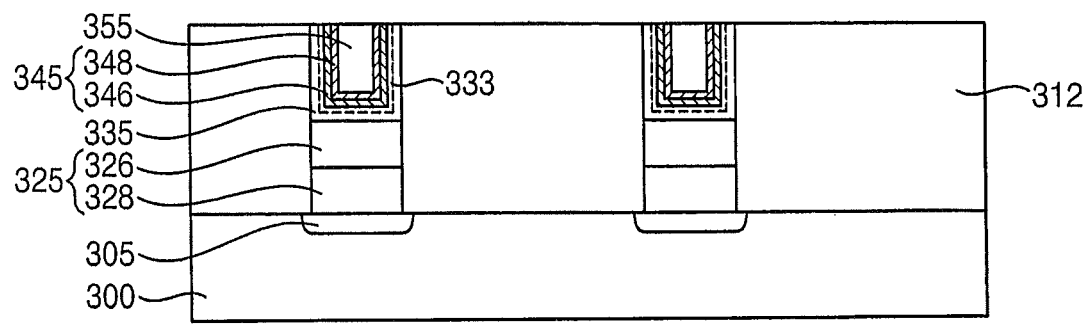
Figure 11F:
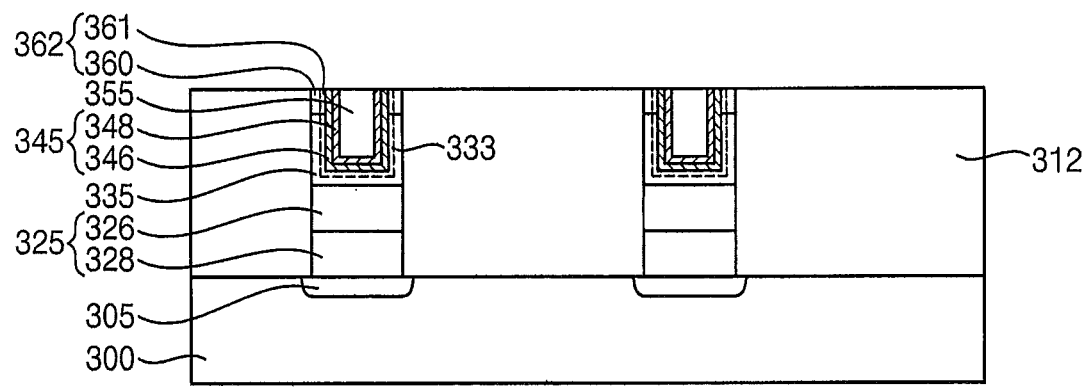
Figure 11G:
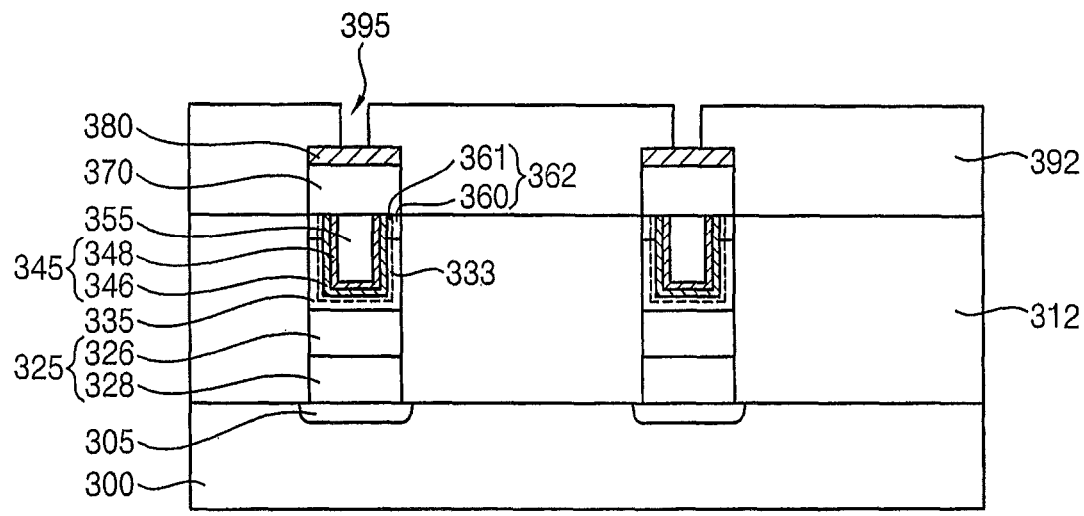

Referring to FIG. 11G, a second insulation layer 392 is formed on the first insulation layer 312 and extends across the second electrodes 380. Openings 395 in the second insulation layer 392 expose a least a portion of the second electrodes 380.

Figure 11H:
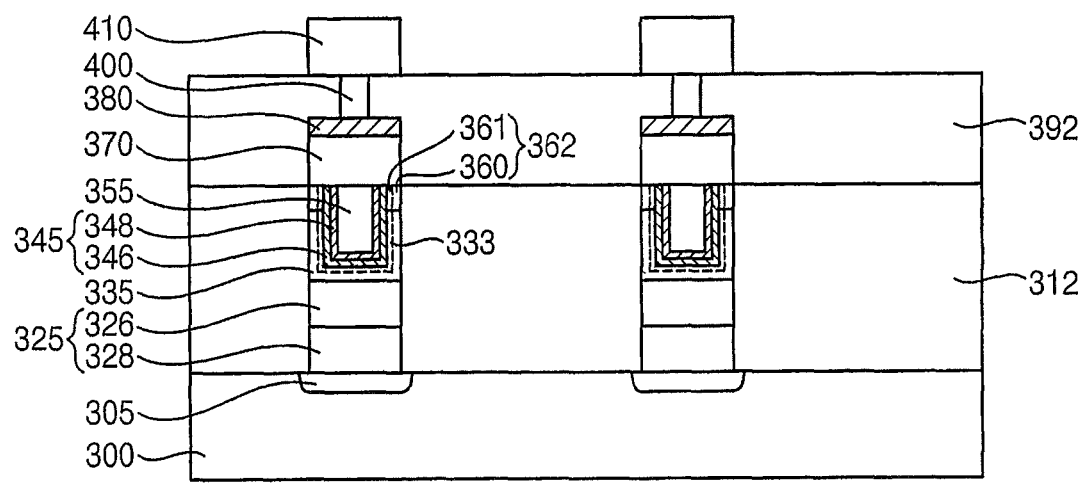

Referring to FIG. 11H, conductive lines 410 are formed on the second insulation layer 392. Conductive contacts 400 extend through the openings 395 to interconnect the conductive lines 410 and the second electrodes 380.

Figure 11I:
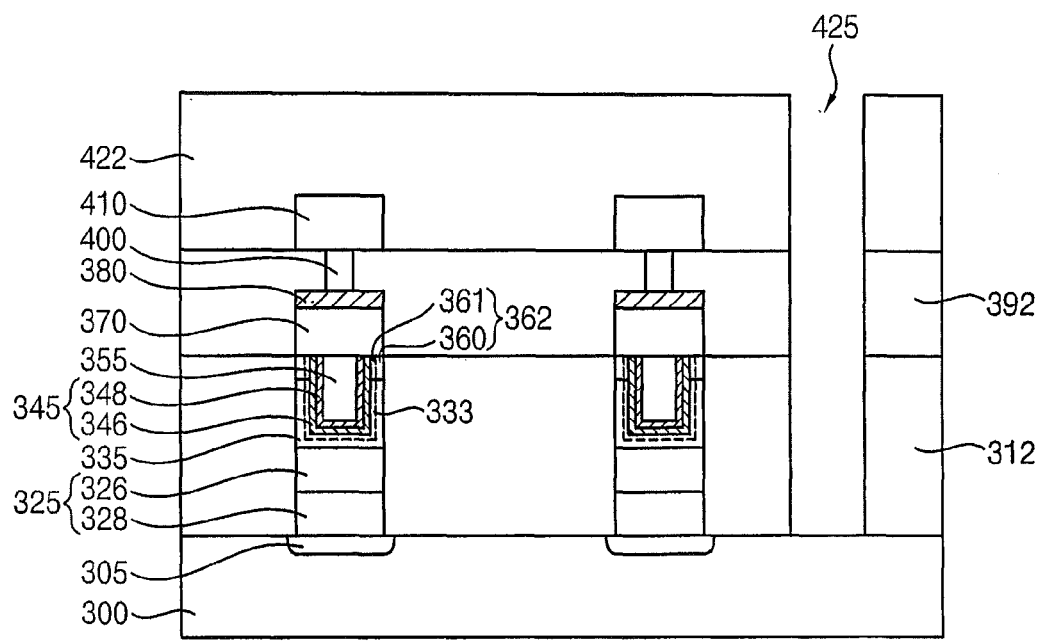

Referring to FIG. 11I, a third insulation layer 422 is formed on the second insulation layer and extends across the conductive lines 410. An opening 425 is formed through the first insulation layer 312, the second insulation layer 392, in the third insulation layer 422 to expose an active region on the substrate 300.

Figure 11J:
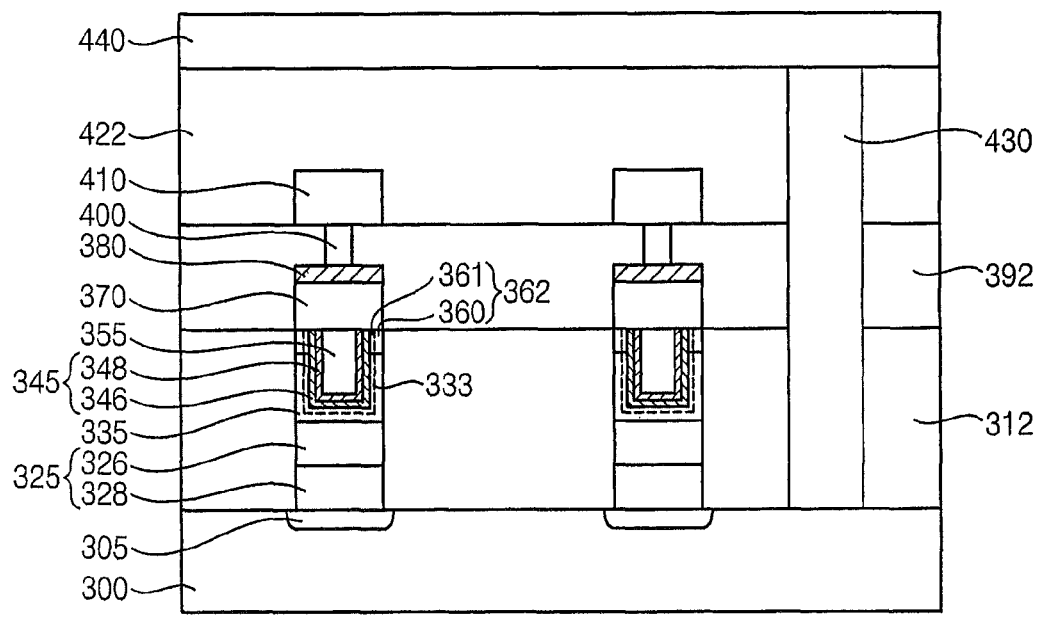

Referring to FIG. 11J, a conductive contact 430 is formed in the opening 425. A conductive line 440 is formed on the third insulation layer 422 and on the conductive contact 430, so that the conductive line 440 is electrically connected to the active region of a substrate 300.

Although three insulation layers 312, 392, and 422 have been shown, it is to be understood that any number of insulation layers may alternatively be used.

FIGS. 12A-I are cross-sectional views illustrating methods of fabricating transistor type PRAM devices, such as the device that is shown in FIG. 10, in accordance with some embodiments of the present invention.

Figure 12A:
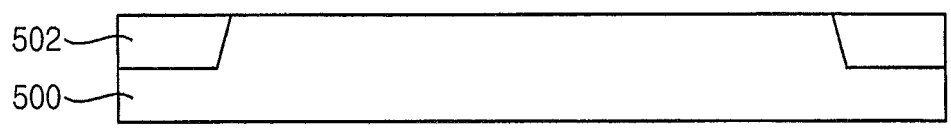
FIGS. 12A-I are cross-sectional views illustrating methods of fabricating transistor type PRAM devices, such as the transistor type PRAM device of FIG. 10, in accordance with some embodiments of the present invention.
Figure 12B:
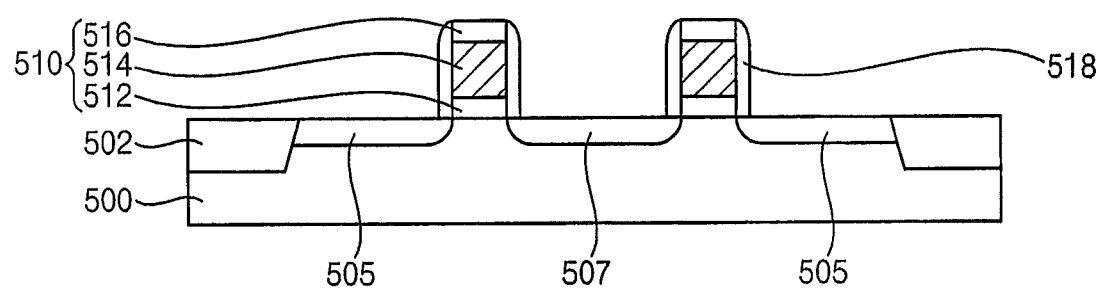

Referring to FIGS. 12A-B, isolation regions 502 are formed in a semiconductor substrate 500. Source and drain regions 505 and 507 are formed by implanting impurity ions in the substrate 500. Gate structures 510 are formed on channel regions, between the source and drain regions 505 and 507. The gate structures 510 are formed by depositing and patterning a tunnel insulation layer 512, a gate layer 514, and a capping layer 516. Sidewall spacers 518 are formed on sidewalls of the gate structures 510.

Figure 12C:
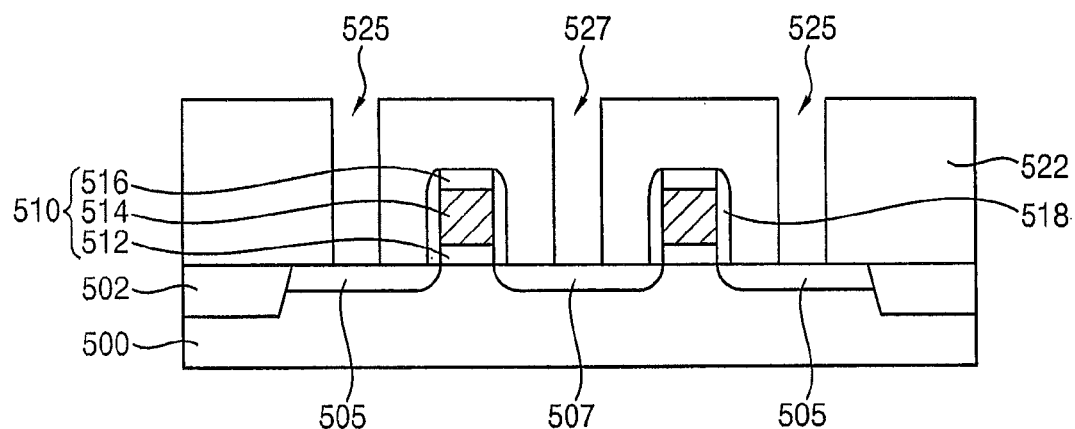

Referring to FIG. 12C, a first insulation layer 522 is formed on the structure of FIG. 12B. Openings 525 and 527 are formed through the first insulation layer 522 to expose the source and drain regions 505 and 507 of the substrate 500.

Figure 12D:
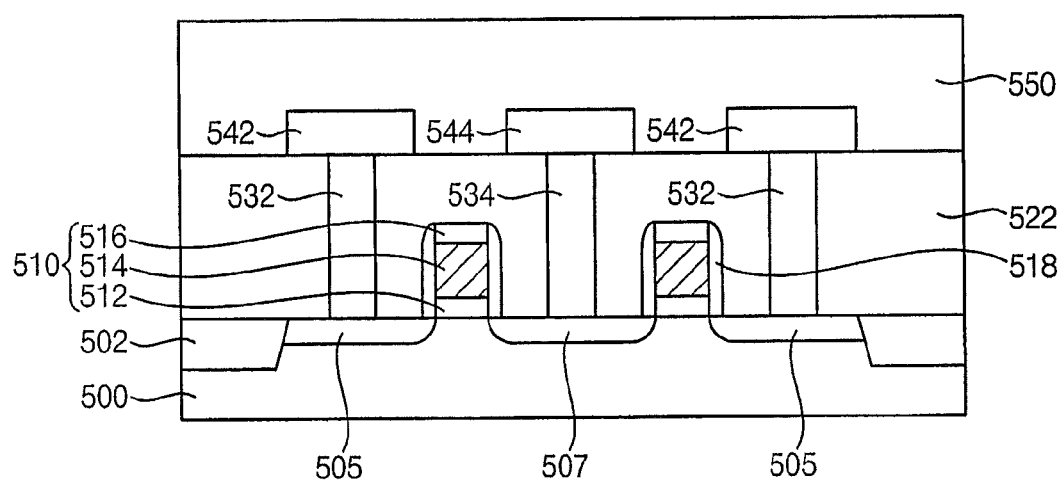

Referring to FIG. 12D, conductive contacts 532 extend through the openings 525 to contact one type of the source and drain regions 505 and 507. Contact pads 542 are formed on the conductive contacts 532 and on the first insulation layer 522. A conductive contact 534 extends through the opening 527 to contact another type of the source and drain regions 505 and 507. A conductive line 544 is formed on the conductive contact 534 and on the first insulation layer 522.

Figure 12E:
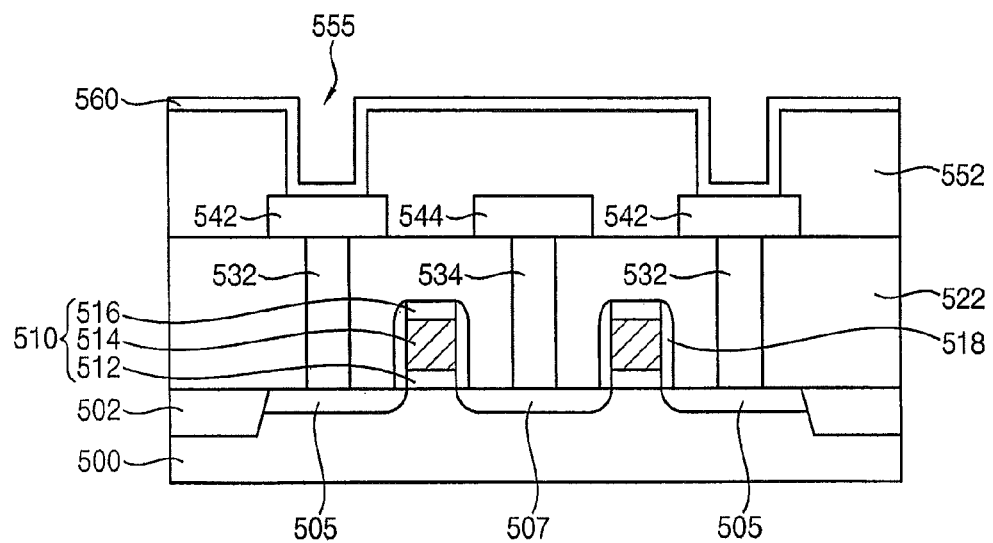

Referring to FIG. 12E, a second insulation layer 552 is formed on the structure of FIG. 12D. Openings 555 are formed that extend through a portion of the second insulation layer 552 to expose at least a portion of the contact pads 542. A doped silicon layer 560 is formed on the second insulation layer 552, along sidewalls of the opening 555, and on an upper surface of the contact pads 542.

Figure 12F:
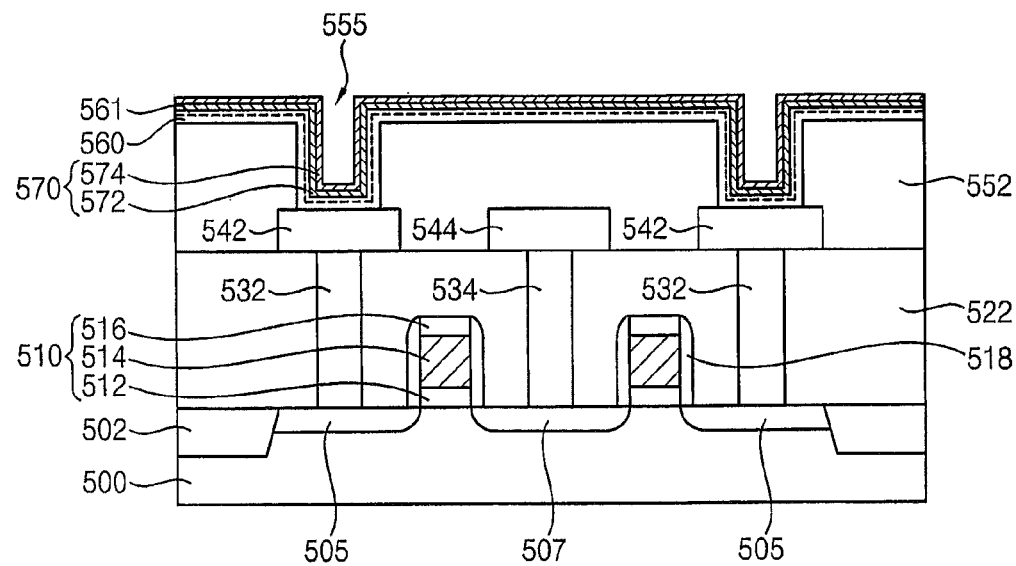

Referring to FIG. 12F, a first electrode layer 570 is formed on the doped silicon layer 560 including along the sidewalls of the opening 555 and on the contact pads 542. The first electrode layer 570 can include a metal layer 572 and a metal nitride layer 574. A metal layer 572 can be formed so as to react with the doped silicon layer 560 to form a metal silicide ohmic layer 561 along an interface there between. When the metal layer 572 includes titanium (Ti), the ohmic layer 561 may be formed as a titanium silicide (TiSix) layer. Alternatively, when the metal layer 572 includes cobalt (Co), the ohmic layer 561 may be formed as a cobalt silicide (CoSix) layer. The metal nitride layer 517 is formed on the metal layer 572.

Figure 12G:
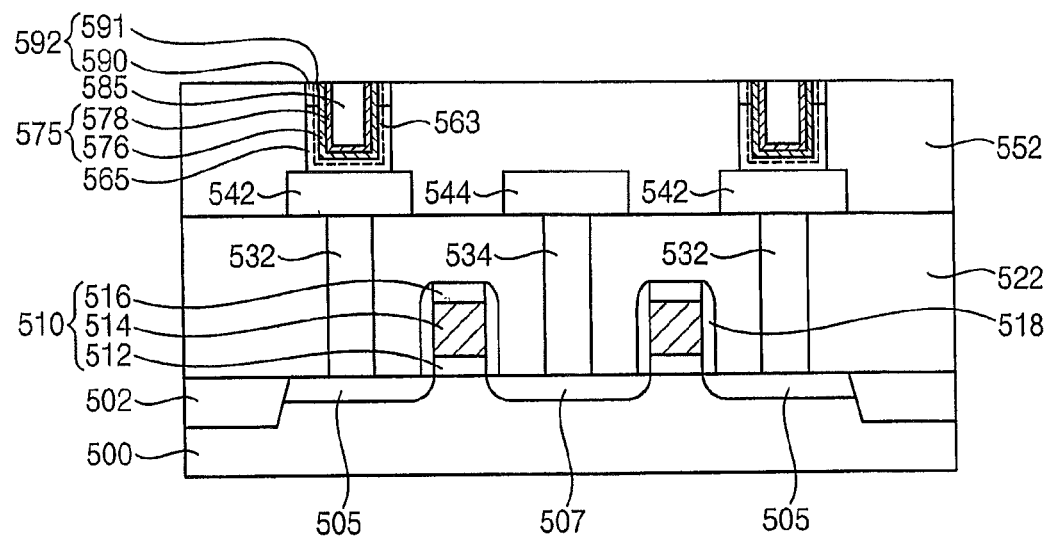

Referring to FIG. 12G, a filling layer, which may include doped or undoped silicon, is formed on the metal nitride layer 574 to at least partially fill, and may completely fill, the openings 555. The filling layer, the metal nitride layer 574, the metal layer 572, the ohmic layer 561, and the doped silicon layer 560 are etched to expose upper surfaces of the second insulation layer 552 and result in formation of a doped silicon layer 565, an ohmic layer 563, a metal layer 576 and a metal nitride layer 578, which collectively form a first electrode 575, and results in formation of a filling member 585.

An upper portion 592 of the doped silicon layer 565 and the ohmic layer 563 is changed to have insulative properties by, for example: introducing nitrogen into a doped silicon layer upper portion 590 and an ohmic layer upper portion 591; oxidizing the doped silicon layer upper portion 590 and the ohmic layer upper portion 591; and/or recessing the doped silicon layer upper portion 590 and the ohmic layer upper portion 591 and depositing and patterning thereon an insulative material (e.g., silicon nitride and/or silicon oxide).

Figure 12H:
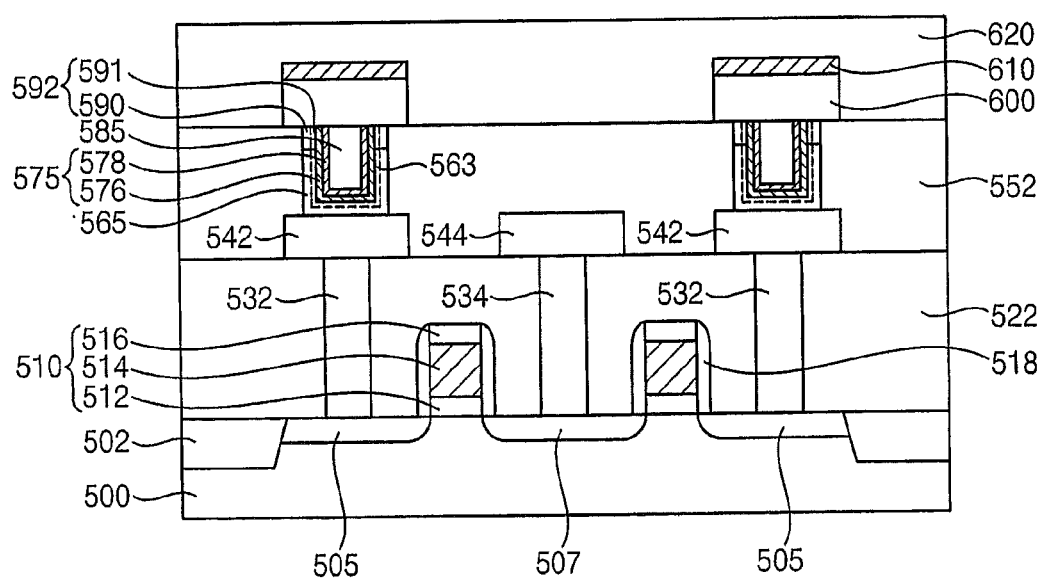

Referring to FIG. 12H, variable resistivity material layers 600 are formed on an upper surface of the second insulation layer 552, the insulative upper portion 592 of the doped silicon layer 565 and the ohmic layer 563, the filling member 585, and is electrically connected to the first electrode 575. The variable resistivity material layers 600 may include a phase changeable material such as a chalcogenide material that includes, for example, germanium (Ge), antimony (Sb), and/or tellurium (Te). Second electrodes 610 are formed on the variable resistivity material layer 275. A third insulation layer 620 is formed on the second insulation layer 552 that extends across the second electrodes 610.

Figure 12I:
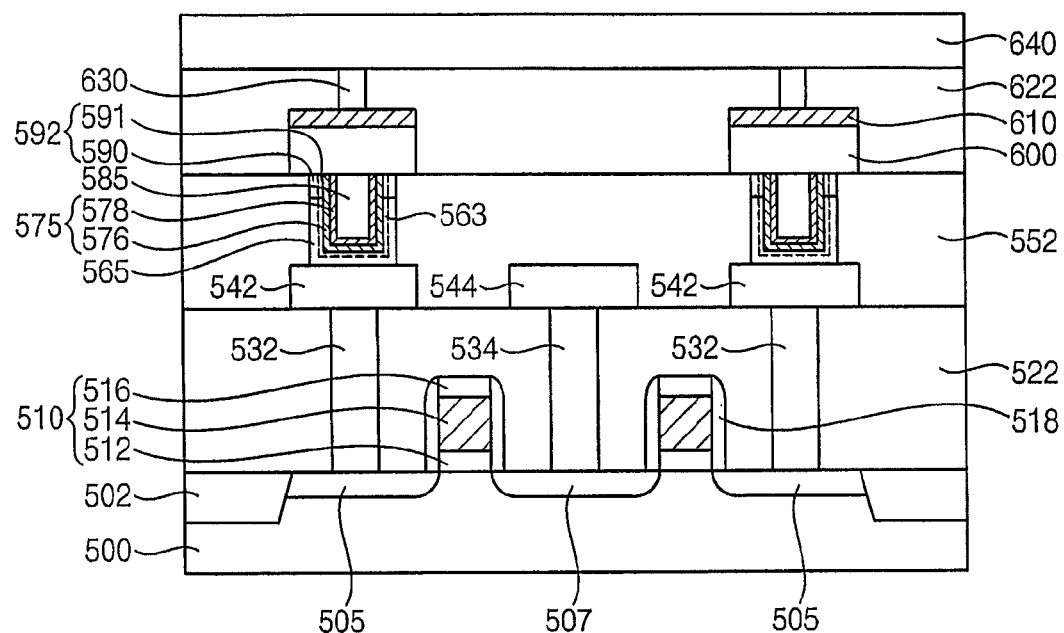

Referring to FIG. 12I, a conductive line 640 is formed on the third insulation layer 622. Conductive contact 630 interconnect the conductive line 640 and the second electrode 610 through the third insulation layer 622. Although three insulation layers 522, 552, and 622 have been shown, it is to be understood that any number of insulation layers may alternatively be used.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. The invention is defined by the following claims, with equivalents of the claims to be included therein.

What is claimed is:

1. An integrated circuit memory cell comprising:
   a substrate;
   a conductive structure on the substrate;
   an insulation layer with an opening that exposes the structure;
   a doped silicon layer on the upper surface of the conductive structure and extending away from the conductive structure along at least a portion of a sidewall of the opening;
   a metal layer on the doped silicon layer with a metal silicide layer along an interface between the metal layer and the doped silicon layer, the metal silicide layer forming a cup-shaped ohmic layer extending away from the conductive structure along at least a portion of a sidewall of the opening, and the metal layer forming an electrode layer; and
   a variable resistivity material on the insulation layer and electrically connected to the electrode layer.

2. The integrated circuit memory cell of claim 1, wherein the variable resistivity material comprises a chalcogenide material.

3. The integrated circuit memory cell of claim 1, wherein the ohmic layer is on an upper surface of the conductive structure and extends away from the conductive structure along at least a major portion of a sidewall of the opening above the structure.

4. The integrated circuit memory cell of claim 3, wherein the ohmic layer is on an upper surface of the conductive structure and extends away from the structure along at least 50% of a sidewall of the opening above the conductive structure.

5. The integrated circuit memory cell of claim 1, wherein the ohmic layer entirely surrounds at least a major portion of sidewalls of the electrode layer within the opening.

6. The integrated circuit memory cell of claim 1, wherein the metal layer comprises a refractory metal.

7. The integrated circuit memory cell of claim 1, wherein the metal layer comprises at least one of: 1) a titanium (Ti) layer on the doped silicon (Si) layer to form a titanium silicide (TiSix) layer along an interface between the titanium (Ti) layer and the doped silicon (Si) layer; and 2) a cobalt (Co) layer on the doped silicon layer (Si) to form a cobalt silicide (CoSix) layer along an interface between the cobalt (Co) layer and the doped silicon (Si) layer.

8. The integrated circuit memory cell of claim 1, wherein the ohmic layer is on the upper surface of the structure and extends away from the structure along at least a portion of a sidewall of the opening.

9. The integrated circuit memory cell of claim 8, wherein the metal silicide layer is on the upper surface of the structure and extends away from the structure along at least a portion of a sidewall of the opening.

10. The integrated circuit memory cell of claim 1, wherein the electrode layer comprises:
    a metal layer on an upper surface of the conductive structure and extends away from the structure along at least a portion of a sidewall of the opening; and
    a metal nitride layer covering the metal layer in the opening.

11. The integrated circuit memory cell of claim 1, further comprising an insulation filling member that is on the metal nitride layer and at least partially fills the opening, wherein the insulation filling member comprises a nitride material and/or a silicon material, and wherein the variable resistivity material is on the insulation layer, on the electrode layer, and on the insulating filling member.

12. The integrated circuit memory cell of claim 1, wherein the conductive structure comprises a diode structure that is electrically connected to an impurity region of the substrate.

13. The integrated circuit memory cell of claim 1, wherein the conductive structure comprises a conductive contact that is electrically connected to a terminal of a transistor on the substrate.

14. An integrated circuit memory cell comprising:
  a substrate;
  a conductive structure on the substrate;
  an insulation layer with an opening that exposes the conductive structure;
  a cup-shaped ohmic layer on the structure and extending away from the structure along at least a portion of a sidewall of the opening;
  an insulator ring on an upper surface of the ohmic layer;
  an electrode layer on sidewalls and a top surface of an interior of the ohmic layer; and
  a variable resistivity material on the insulation layer and electrically connected to the electrode layer, wherein the insulator ring insulates the variable resistivity material from the ohmic layer.

15. The integrated circuit memory cell of claim 14, wherein the variable resistivity material comprises a chalcogenide material.

16. The integrated circuit memory cell of claim 14, wherein the insulator ring comprises an oxide of an upper portion of the ohmic layer in the opening.

17. The integrated circuit memory cell of claim 14, wherein the insulator ring comprises a nitride upper portion of the ohmic layer in the opening.

18. The integrated circuit memory cell of claim 14, wherein the ohmic layer comprises:
  a doped silicon layer on the upper surface of the conductive structure and extends away from the structure along at least a portion of a sidewall of the opening; and
  a metal layer on the doped silicon layer with a metal silicide layer along an interface between the metal layer and the doped silicon layer, the metal silicide layer forming the ohmic layer.

19. The integrated circuit memory cell of claim 14, wherein the conductive structure comprises a diode structure that is electrically connected to an impurity region of the substrate.

20. The integrated circuit memory cell of claim 14, wherein the conductive structure comprises a conductive contact that is electrically connected to a terminal of a transistor on the substrate.

* * * * *